US007603641B2

(12) United States Patent
Lin

(10) Patent No.: US 7,603,641 B2
(45) Date of Patent: Oct. 13, 2009

(54) POWER/GROUND WIRE ROUTING CORRECTION AND OPTIMIZATION

(75) Inventor: Ta-Cheng Lin, Fremont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 282 days.

(21) Appl. No.: 11/236,222

(22) Filed: Sep. 26, 2005

(65) Prior Publication Data
US 2006/0080630 A1    Apr. 13, 2006

Related U.S. Application Data

(63) Continuation-in-part of application No. 10/979,868, filed on Nov. 1, 2004, now abandoned.

(60) Provisional application No. 60/612,877, filed on Sep. 24, 2004, provisional application No. 60/517,358, filed on Nov. 2, 2003.

(51) Int. Cl.
*G06F 17/50* (2006.01)
(52) U.S. Cl. .............................. 716/8; 716/2
(58) Field of Classification Search ...................... 716/8, 716/12–14, 2
See application file for complete search history.

(56) References Cited

U.S. PATENT DOCUMENTS 5,349,542 A * 9/1994 Brasen et al. ................. 703/15

| 6,405,354 | B1 * | 6/2002 | Itazu et al. ................. 716/8 |
| 7,016,794 | B2 * | 3/2006 | Schultz .................... 702/64 |
| 7,203,914 | B2 * | 4/2007 | Wood ........................ 716/4 |
| 2004/0078767 | A1 * | 4/2004 | Burks et al. ................ 716/8 |
| 2004/0168136 | A1 * | 8/2004 | Mau et al. .................. 716/4 |
| 2005/0010883 | A1 * | 1/2005 | Wood ........................ 716/6 |
| 2006/0095874 | A1 * | 5/2006 | Jiang et al. ................. 716/2 |

OTHER PUBLICATIONS

Wu, Su-Wei et al., "Efficient power/ground network analysis for power integrity-driven design methodlogy", Jun. 2004, ACM, pp. 1-4.*
Singh, Jaskirat et al., "Congestion-aware topology optimization of structured power/ground networks", 2003, IEEE, pp. 1-11.*

* cited by examiner

*Primary Examiner*—Stacy A Whitmore
(74) *Attorney, Agent, or Firm*—Banner & Witcoff, Ltd.

(57) ABSTRACT

A PG wire routing optimization tool for more efficiently routing PG wires in a layout design of an integrated circuit. The PG wire routing optimization tool analyzes a routing of the wires of a power and ground network for unacceptable IR-drops or electromigration problems. If one or more problems are discovered, the PG wire routing optimization tool determines design constraints for the wires that will correct the identified problems. It then initiates a floor planning tool to implement these corrective design constraints in the floor plan design. The PG wire routing optimization tool may alternately or additionally determine design constraints that will minimize the area of the wiring but will avoid creating new IR-drop or electromigration problems. It will then initiate a floor planning tool to implement these optimizing design constraints in the floor plan design.

62 Claims, 26 Drawing Sheets

POWER/GROUND WIRE ROUTING CORRECTION AND OPTIMIZATION

RELATED APPLICATIONS

This application is a continuation-in-part application of U.S. patent application Ser. No. 10/979,868, entitled "Elastic Assembly Floor Plan Design Tool," filed on Nov. 1, 2004 and naming Chih-Liang Cheng et al. as inventors, which in turn is a continuation-in-part application of U.S. Provisional Patent Application No. 60/517,358, entitled "Elastic Assembly Tool", filed on Nov. 2, 2003, and naming Chih-Liang Cheng et al. as inventors, both of which applications are incorporated entirely herein by reference. This application also is a continuation-in-part application of U.S. Provisional Patent Application No. 60/612,877, entitled "Chip Level Power/Ground Network Optimization Methodology," filed on Sep. 24, 2004, and naming Ta-Cheng Lin et al. as inventors, which application also is incorporated entirely herein by reference.

FIELD OF THE INVENTION

The present invention relates to the design of microdevices. Various aspects of the present invention are particularly applicable to the routing of power and ground (PG) network wires during a placement process.

BACKGROUND OF THE INVENTION

Microdevices, such as microcircuits formed on a substrate, continue to become more and more complex. A conventional integrated circuit may contain several million transistors, making these devices very difficult to design and fabricate. Moreover, the layout of elements in a microcircuit design typically is not a linear process. Instead, the complexity of laying out the elements of a microcircuit more closely correlates to the formula n log n, where n is the number of elements in the design.

In order to address this complexity, microcircuit designers often will combine several smaller designs in a hierarchical arrangement to form a larger microcircuit design. Typically, each smaller design, sometimes referred to as a "cell" or "block," describes a group of circuit elements that have been configured to form one or more functional components. In some situations, this block may be new. Frequently, however, a block simply will be copied from a library of existing circuit designs. For example, rather than creating a new design for a memory device, a circuit designer may simply obtain a previously-created design of a memory device from a library of circuit components. By using a design for a group of circuit elements as a single block, a designer can more easily create a larger microcircuit design.

Even if a designer employs blocks of circuit elements to create a larger microcircuit design, however, the designer must still physically arrange those blocks relative to each other for placement on a substrate. More particularly, the designer must create a "floor plan" for the microcircuit design. The floor plan will include the perimeter for the microcircuit design. This perimeter defines the size and shape of the microcircuit that will be fabricated from the design. The floor plan also will include the position of the various contact pads required by the microcircuit. These pads, arranged along the periphery of the floor plan perimeter, specify the connection points for the power, ground, and input/output pins that will connect the microcircuit to a power supply, an electrical ground, and other devices. The blocks of circuit elements then are arranged in the "core" area inside of the contact pads. With some blocks, the size and shape of the block are predefined. For other blocks, the block design may simply require a minimum area for the block. The particular shape of the block then may be specified by the designer.

The floor plan also may include one or more of the conductive lines or "wires" that will be included in the microcircuit design. In particular, the floor plan usually will include those wire structures that will take up a large amount of space in the circuit design. As will be appreciated by those of ordinary skill in the art, the power supply and ground wires that handle large currents typically are wider than signal wires that carry lower current clock signals, data signals and control signals. These power and ground wires thus may be included in a floor plan design. In addition, the designer must be able to easily connect the power and ground inputs of every component to a power or ground wire such that each component receives the same amount of power in a consistent manner. Accordingly, primary power and ground lines (sometimes referred to as a power/ground "network" wires) typically must be routed throughout the entire area floor plan design. If the designer is uncertain as to the placement of the power and ground connections for a block, then the power/ground network wires may even need to be arranged to encircle the block. This power/ground network structure is sometimes referred to as a power/ground network "ring."

In addition to the layout of the component blocks, the packaging for a microcircuit will also affect the routing of data signal, control signal, power and ground wires between the blocks. A microcircuit's package will have a fixed number of pins for external connections to the microcircuit, so the clock signal wires, data signal wires, control signal wires, power wires and ground wires for the blocks must be routed to the contact pads for these pins without congestion and without lengthening the wires beyond a maximum distance.

There are two types of routing for electrical connection wires: global routing and detailed (or "local") routing. Global routing defines the overall directions in which the wires are laid out to avoid large structures. Detailed routing then specifies the local detours for the wires that are taken along those general directions to avoid other wires or smaller structures. Because of the complexity of the detailed routing process, this process is typically very time-consuming, so it usually is preferable to avoid congestion as much as possible during global routing, to simplify the detailed routing process.

Conventionally, the process of creating a floor plan design includes several steps. First, a designer will lay out a proposed floor plan for the component blocks. Next, the designer will assign pin placements for the microcircuit package by, for example, defining the locations of the contact pads for each pin. The designer will then globally route each group of large wiring structures among the blocks, such as power and ground (PG) wires, guard bands and signal wires grouped into a bus. Once the layout has been completed, the designer must analyze the layout to determine if it meets various constraints. For example, once the power and ground (PG) wiring has been routed, the layout design is analyzed to determine if the routing creates an unacceptable voltage drop (conventionally referred to an IR-drop). The layout also is analyzed to determine if the power and ground (PG) wiring creates an electromigration issue. This occurs, e.g., where a wire is too thin to allow the electrons to follow the direction of the wire. Instead, the electrons will tend to "break through" the wire.

If the PG wiring in the layout does not meet the required constraints, then the designer must delete the PG wire routing and repeat the PG wire routing portion of the placement and routing design process. To avoid having to repeat this process, many designers will "overdesign" the (PG) wire routing. For example, the designer may specify PG wires for the layout design that are much wider than necessary, to avoid any potential IR-drop or electromigration problems. The area that is unnecessarily used by overdesigning the PG wiring thus either increased the overall size of the circuit, or reduces the amount of area available to place or expand the blocks which in turn may lead to timing problems for the circuit. Some conventional placement and routing tools attempt to address this problem by providing automatic suggestions to a designer during the (PG) wire network routing design process. These abstract suggestions, however, do not take into account the specific floor plan and PG wire routing of a particular integrated circuit design.

BRIEF SUMMARY OF THE INVENTION

Various examples of the invention provide a tool that a designer may employ to more efficiently route PG wires in a layout design of an integrated circuit. More particularly, various examples of the invention provide a PG wire routing optimization tool that analyzes a routing of PG wires for unacceptable IR-drops or electromigration problems. If one or more problems are discovered, the PG wire routing optimization tool determines design constraints for the wires that will correct the identified problems. It may then initiate a floor planning tool to implement these corrective design constraints in the floor plan design. With some examples of the invention, the PG wire routing optimization tool may alternately or additionally determine design constraints that will minimize the area of the PG wiring but will avoid creating new IR-drop or electromigration problems. It may then again initiate a floor planning tool to implement these optimizing design constraints in the floor plan design.

DETAILED DESCRIPTION OF THE INVENTION

Overview

Figure 1:
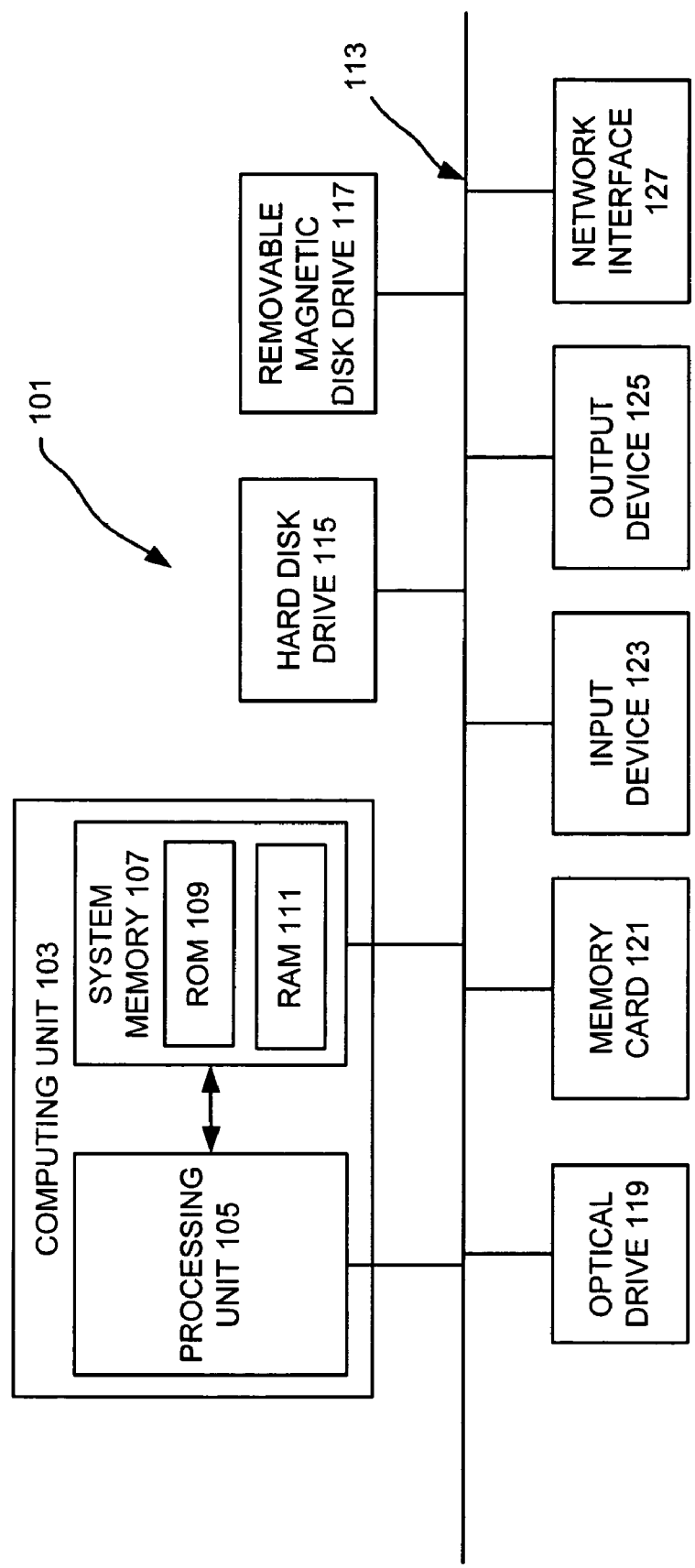
FIG. 1 illustrates an example of a programmable computer that can be used to implement various embodiments of the invention.

As will be discussed in more detail below, various implementations of the invention relate to a PG wire routing optimization tool that a designer may employ to more efficiently route PG wires in a layout design of an integrated circuit. With some examples of the invention, the PG wire routing optimization tool analyzes the routing of PG wires in an integrated circuit layout design for unacceptable IR-drops or electromigration problems. If one or more specified problems are discovered, the PG wire routing optimization tool determines new design constraints for the wires that will correct the identified problems. The PG wire routing optimization tool will then invoke the operation of a placement and routing tool to implement these corrective design constraints in the floor plan design. With still other examples of the invention, the PG wire routing optimization tool will alternately or additionally determine new design constraints for the wiring that will minimize the total area of the wiring without creating IR-drop or electromigration problems. Once the PG wire routing optimization tool has determined new design constraints for the wiring, the tool will then invoke a floor planning tool to implement these optimizing design constraints in the floor plan design.

Accordingly, an example a floor planning tool that may be employed with various implementations of the invention will be discussed. In particular, the floor planning tool allows a designer to easily position components of a microcircuit in a floor plan design, while maintaining desired attributes for the design. As used herein, the term "block" refers to the representation in a floor plan design of any group of circuit elements in a microcircuit design that may be repositioned, added, deleted or otherwise manipulated as a group. By using a pointing device, such as a keyboard, mouse, stylus, touchpad, joystick or the like, a circuit designer can select and move the placement of one or more of the blocks making up the floor plan design. As the designer moves a selected "target" block, the user interface graphically displays the various changes in the circuit characteristics and design that will result from the movement of the target block.

For example, the user interface may indicate when the movement of the target block will cause the electrical connections near the block to become more or less congested. With some examples of the floor planning tool, it may even reroute electrical connections near the block based upon the block's movement. The tool's user interface may then display the new routing to the designer. If the designer is satisfied with the revised floor plan design and routing changes, the designer can choose to make the changes permanent to the floor plan design. If, however, the designer is dissatisfied with the new floor plan or its associated connection routing, the designer may then decline the changes displayed in the user interface, thereby maintaining the original floor plan design. In this manner, a design may experiment with different floor plan designs without modifying an original floor plan design.

With still other examples of the floor planning tool, the floor planning tool may also change one or more features of the circuit design in response to movement of a block in order to maintain one or more desired attributes. For example, a designer may specify that all blocks within a floor plan design maintain a minimum separation distance from each other. If the designer moves a target block too close to an adjacent block (i.e., a block adjacent to the target block), then the floor planning tool may move the adjacent block to maintain the minimum specified distance between the blocks of the circuit design. Some implementations may also move one or more blocks that are adjacent to the first adjacent block in order to maintain the minimum specified distance between the blocks. Thus, when a designer moves a target block to assemble a floor plan design, the user interface may "elastically" move one or more adjacent blocks in response.

With various examples of the floor planning tool, a designer may select which features of the circuit design are displayed in the user interface. For example, a designer may wish only to view the impact that moving a block will have on the routing of the power/ground network wires in the circuit. In other circumstances, however, the designer may wish to view the changes to one or more signal wires that would result from moving a block, or to both the power/ground network and signal wires.

Operating Environment

Various examples of a PG routing wire optimization tool according to the invention may be implemented through the execution of software instructions by a computing device, such as a programmable computer. Similarly, a floor planning tool employed by a PG wire routing optimization tool according to various examples of the invention also may be implemented through the execution of software instructions by a computing device, such as a programmable computer. An illustrative example of such a computing device 101 therefore is illustrated in FIG. 1. As seen in this figure, the computing device 101 has a computing unit 103. The computing unit 103 typically includes a processing unit 105 and a system memory 107. The processing unit 105 may be any type of processing device for executing software instructions, but will conventionally be a microprocessor device. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a hard disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers.

With some implementations, the computing unit 103 may be directly or indirectly connected to one or more network interfaces 127 for communicating with a network. The network interface 127 translates data and control signals from the computing unit 103 into network messages according to one or more communication protocols, such as the transmission control protocol (TCP) and the Internet protocol (IP). These protocols are well known in the art, and thus will not be discussed here in more detail. An interface 127 may employ any suitable connection agent (or combination of agents) for connecting to a network, including, for example, a wireless transceiver, a modem, or an Ethernet connection.

It should be appreciated that one or more of these peripheral devices may be housed with the computing unit 103 and bus 113. Alternately or additionally, one or more of these peripheral devices may be housed separately from the computing unit 103 and bus 113, and then connected (either directly or indirectly) to the bus 113. Also, it should be appreciated that both computers and computing appliances may include any of the components illustrated in FIG. 1, may include only a subset of the components illustrated in FIG. 1, or may include an alternate combination of components, including some components that are not shown in FIG. 1.

The Elastic Assembly Floor Plan Design Tool

Figure 2:
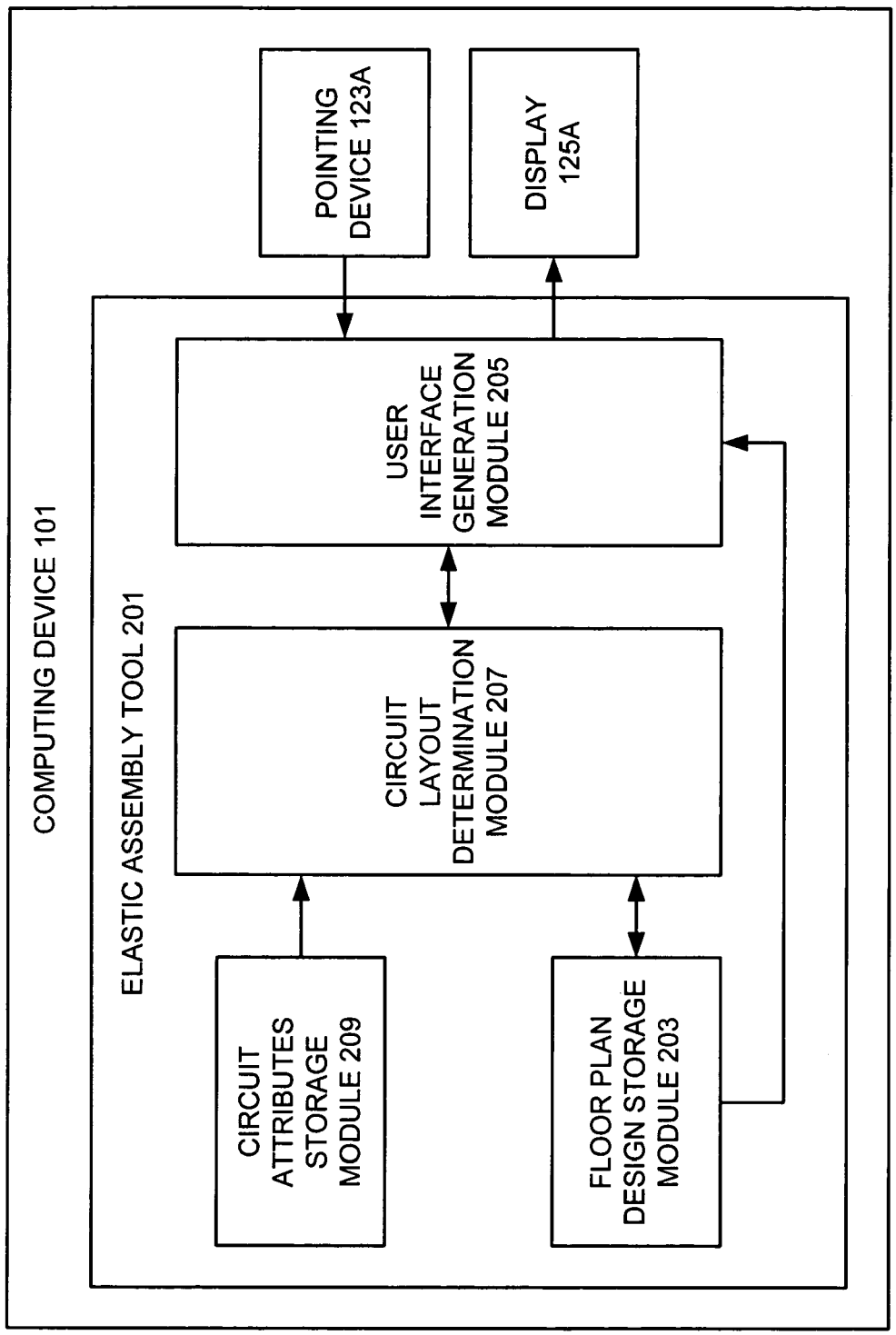
FIG. 2 schematically illustrates an elastic assembly floor planning design tool that can be used with a PG wire routing optimization tool according to various embodiments of the invention.

FIG. 2 schematically illustrates an elastic assembly floor plan design tool 201 that may be employed by a PG wire routing optimization tool according to various examples of the invention. As seen in this figure, the floor plan design tool 201 includes a floor plan design storage module 203, a user interface generation module 205, and a circuit layout determination module 207. The elastic assembly floor plan design tool 201 may also optionally include a circuit attributes storage module 209. As previously noted, each of these modules may be implemented by modules of software instructions that can be executed by a programmable computer stored on a storage medium, through the execution of such software instructions by a programmable computer, by the storage of data on a storage medium, or a combination of thereof.

The floor plan design storage module 203 stores one or more floor plan designs for a microcircuit. These floor plan designs may include one or more existing circuit design layouts that already contain blocks representing one or more components of the microcircuit. Alternately, these floor plan designs may include a blank template to which a designer can add blocks during a design process. In addition to the layout of the blocks, a floor plan design may also include the layout of various other features of the microcircuit, such as the routing of various connection wires associated with the blocks. For example, a floor plan design typically will include features of power and ground (PG) wires, such as power/ground network wires, that will provide electrical power to the components of the circuit.

A floor plan design may alternately or additionally include features for one or more signal wires that will transmit clocking, control and/or data signals to and from the microcircuit components. For example, as previously noted, a "bus" of related signal wires will take up more space than an individual signal wire, so a designer may wish to view the routing of bus signal wires in a floor plan design. Alternately or additionally, a designer may wish to include one or more individual signal wires carrying critical signals in a floor plan design, to ensure that these signal wires are optimally routed. Of course, any desired feature of a circuit design may be included in a floor plan design.

The floor plan design data may be created or stored in any conventional data format that will represent the desired floor plan design structures. For example, various examples of the floor plan design tool 201 can maintain and manipulate the floor plan design in convenient design data formats, such as the Library Exchange Format/Design Exchange Format (LEF/DEF), the "Open Access" database format, or the "Milkyway" data format, each of which are well known in the art, and thus will not be discussed here in further detail. Still other examples of the invention may alternately or additionally employ more complex formats (i.e., formats that provide additional information unnecessary for maintaining and manipulating a floor plan design), such as the GDS II data format or the OASIS data format. With these examples, the floor plan design tool 201 may maintain and manipulate the floor plan design directly in the more complex data format, or convert the more complex data format into a simpler, more convenient design data format such as those listed above. Still other examples of the floor plan design tool 201 may additionally convert the finished floor plan design from a simpler, more convenient design data format into a more complex data format for manufacturing or final verification of the microcircuit design.

When the floor plan design tool 201 is initiated, the floor plan design storage module 203 provides a floor plan design referenced by the PG wire routing optimization tool to the user interface generation module 205. The selected floor plan design will then be displayed by the user interface generation module 205 in a user interface. Of course, any other desired techniques may be used to retrieve and display a floor plan design specified by the PG wire routing optimization tool from the floor plan design storage module. In the illustrated example of the floor plan design tool 201, the floor plan design storage module 203 provides the specified floor plan design to the user interface generation module 205. With alternate examples of the floor plan design tool 201, however, the floor plan design storage module 203 may provide the specified floor plan design to the user interface generation module 205 through the circuit layout determination module 207.

In order to properly render the user interface with the initial floor plan design, the user interface generation module 205 may include various application programming interfaces or other components necessary to create graphic images corresponding to the initial floor plan design. Also, while the user interface generation module 205 is illustrated as being a part of the floor plan design tool 201, with alternate examples of the invention one or more functions of the user interface generation module 205 may be performed by external software applications, such as the operating system for the computing device 101. The display 125A may be any desired type of display including, for example, a cathode ray tube display, a plasma screen display, or a liquid crystal display (LCD).

In response to the design constraints input from the wire routing optimization tool, the user interface generation module 205 will change the displayed position of one or more blocks in the user interface. In addition, the circuit layout determination module 207 determines a new layout for the relevant features of the floor plan design based upon the new position of the target block. This new floor plan design may then be displayed to the user. For example, as will be discussed in more detail below, the circuit layout determination module 207 may determine a new position of a block based upon new constraints provided by the PG wire routing optimization tool for power and ground network wires.

The circuit layout generation module 207 can further have the user interface generation module 205 display one or more of the changes to the specified floor plan design features in the user interface. If the user is satisfied with the revised floor plan design, then the user can choose to make the changes permanent by saving the modified floor plan design in the floor plan design storage module 203. With some examples of the invention, however, if the user is dissatisfied with the new floor plan, the user may then decline the changes displayed in the user interface and thereby maintain the initial floor plan design. In this manner, a user may view and consider different floor plan design changes without modifying the initial floor plan design.

Various examples of the floor plan design tool 201 may include the circuit attributes storage module 209. As will be explained in more detail below, the circuit attributes storage module 209 stores desired attributes for various features of the floor plan design. Thus, the circuit attributes storage module 209 may specify a maximum or minimum distance between various blocks in a floor plan design. Similarly, the circuit attributes storage module 209 may specify a maximum or minimum distance between various wires within the design (e.g., a minimum distance between power wires and ground wires), a maximum or minimum distance between various wires and blocks within the design (e.g., a minimum distance between a block and a power wire), and a minimum width of a wire.

The circuit layout determination module 207 will then revise the floor plan design so that it complies with the requirements specified in the circuit attributes storage module 209. For example, if a designer attempts to move a target block closer than a minimum distance specified in the circuit attributes storage module 209, the circuit layout determination module 207 will not make this change to the floor plan design. Further, the circuit layout determination module 207 may have the user interface generation module 205 prevent the user interface from showing the prohibited movement. With various examples of the invention, the attributes included in the circuit attributes storage module 209 may be provided before the tool 201 is employed, specified by the designer during the floor plan design process, or a combination of both.

The User Interface

Figure 3A:
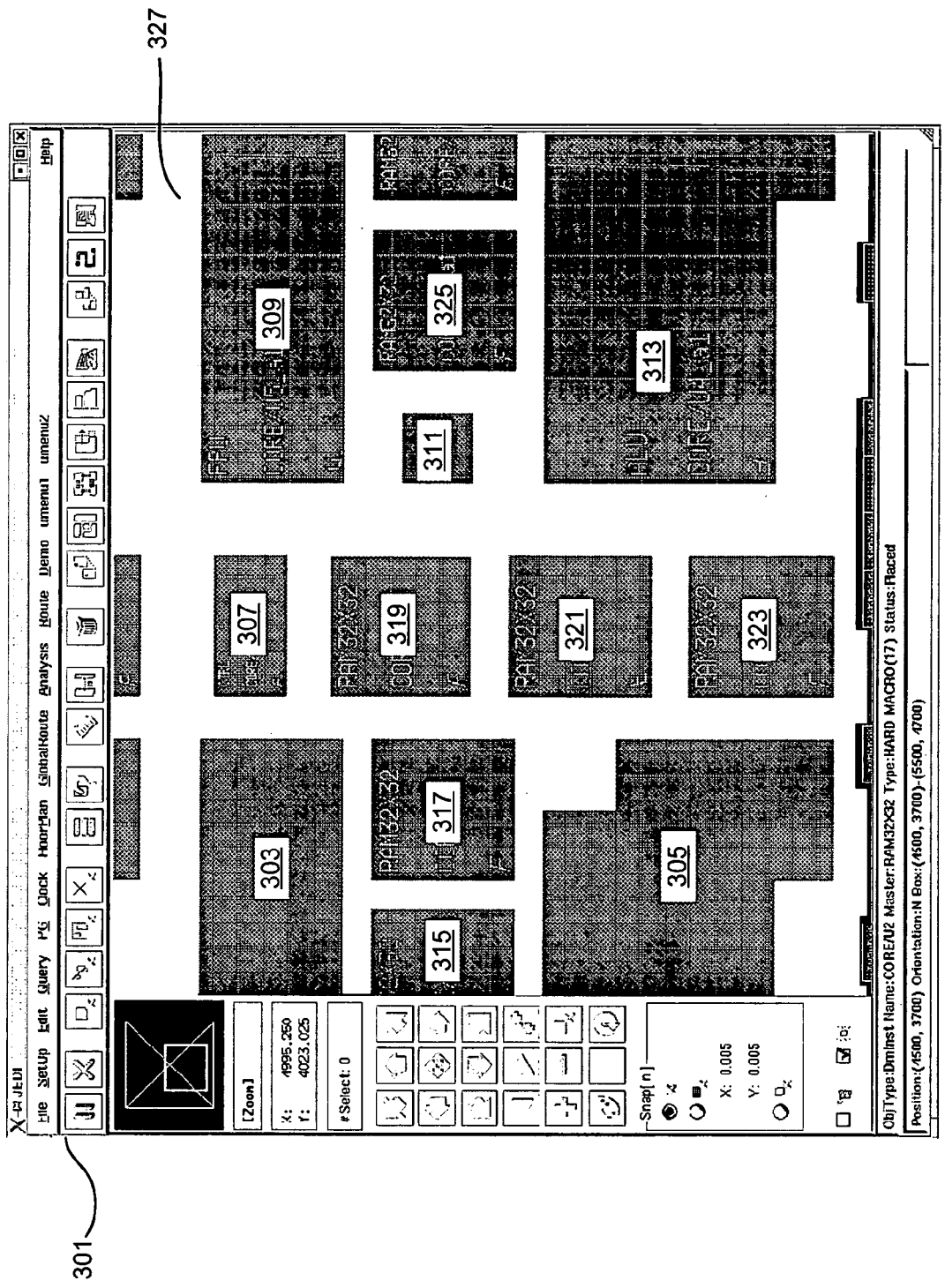
FIGS. 3A, 3B, 4A and 4B show various operations of a user interface of a floor planning design tool that can be used with a PG wire routing optimization tool according to various embodiments of the invention.

FIG. 3A illustrates one example of a user interface 301 that may be provided to a designer according to various examples of the invention. As seen in this figure, the interface 301 displays a floor plan design including various blocks 303-325 representing different components of a microcircuit. For example, block 309 may represent the circuit structures making up a floating point processing unit, while block 313 may represent the circuit structures making up an arithmetic logic unit. Blocks 315-325 may each then represent circuit structures making up a memory device. Each of the blocks 303-325 is displayed on a substrate representation 327, which corresponds to the substrate in which the microcircuit structures represented by the blocks 303-325 will be formed.

In the illustrated example, the blocks 303 and 307-311 and 315-325 are rectangular, while blocks 305 and 313 have irregular shapes that may be formed by overlapping rectangular shapes. Different examples of the invention may alternately or additionally provide for blocks of any desired shape. It should be appreciated, however, that the use of rectilinear blocks having only right angles may allow for easier determination of the features of the microcircuit when a block is moved, as will be explained in more detail below.

Figure 3B:
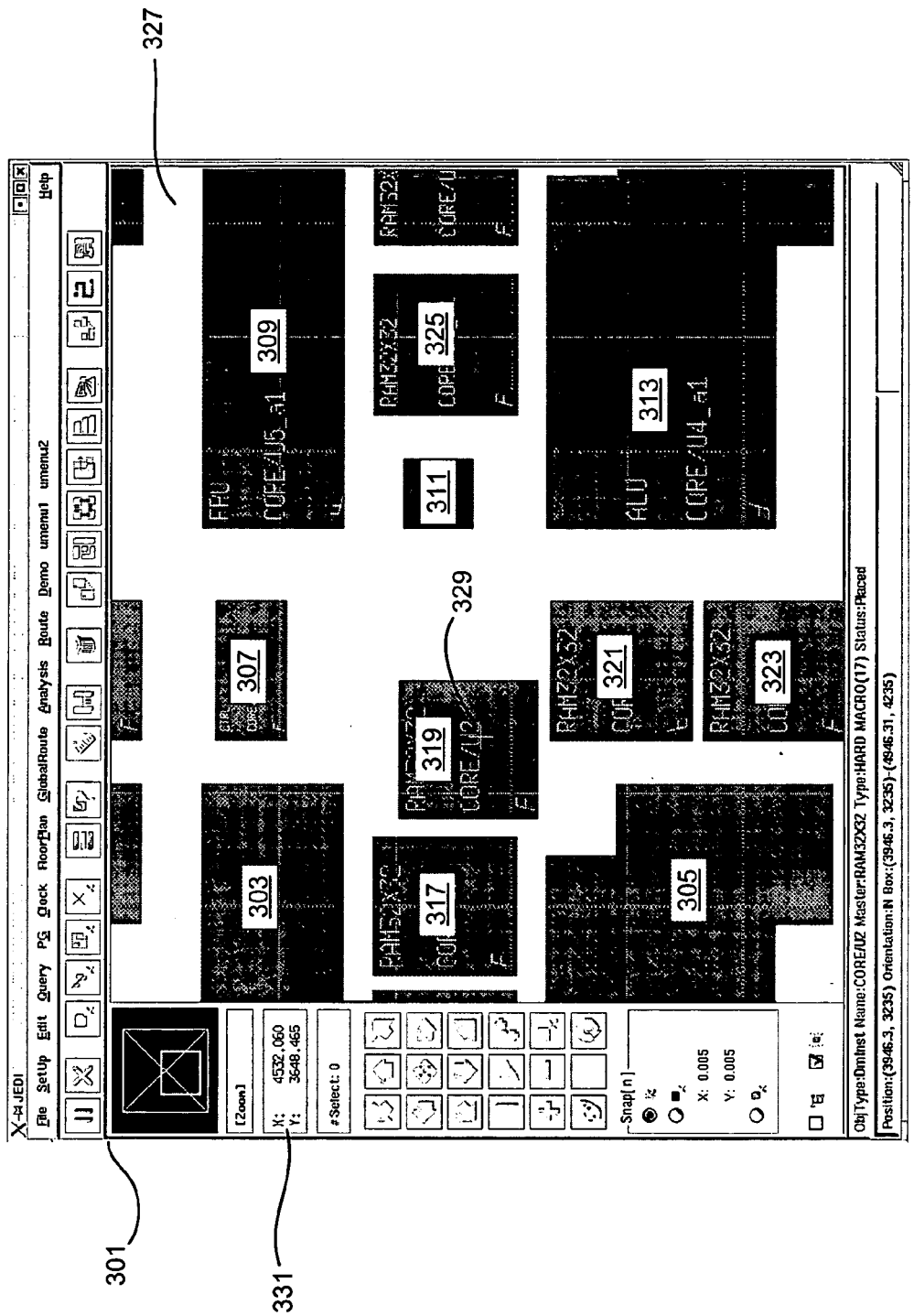

As previously noted, wire design constraints input from the PG wire routing optimization tool may cause the floor plan design tool 201 to move the position of one or more blocks. For example, FIG. 3B illustrates an alternate placement of the blocks 303-325. In this example, block 319 has been moved from its original position shown in FIG. 3A. As will be appreciated by those of ordinary skill in the art, various examples of the floor plan design tool 201 may employ a coordinate system, such as an X-Y Cartesian coordinate system, to identify the placement, movement and orientation of the blocks relative to the floor plan design.

Between the view of the user interface 301 shown in FIG. 3A and the view of the user interface 301 shown in FIG. 3B, block 319 has moved down and to the left. (It should be noted that the use of relative directions throughout is made only to more conveniently explain various features and operations of the invention, and should not be considered limiting.) In addition to moving block 319 in response to input from the PG wire routing optimization tool, some examples of the invention may also move blocks proximal to the a moved block. For example, in FIG. 3B, block 319 has been moved into the area originally occupied by the adjacent blocks 317 and 321 in FIG. 3A. In response, the circuit layout determination module 207 has repositioned the placement of the adjacent blocks 317 and 321. The new positions for these blocks 317 and 321 are then displayed in the user interface 301, as shown in FIG. 3B.

More particularly, as shown in FIG. 3B, the circuit layout determination module 307 has moved the block 317 (located to the left of the block 319) in the left direction. The circuit layout determination module 207 has similarly moved the block 321 (located below the block 319) in the downward direction. Still further, the circuit layout determination module 207 has moved the block 323 adjacent to the moved block 321 (located below the block 321) in a downward direction as well. Thus, one or more of the blocks in a floor plan design may be "elastically" moved to accommodate the movement of a target block. It should be noted that, while only two adjacent blocks are moved in the illustrated example (i.e., blocks 317 and 315 and blocks 321 and 323), any number of blocks may be recursively moved in response to the user's movement of a target block.

As also noted above, the elastic assembly tool 201 may be configured to maintain or enforce one or more circuit attributes defined in the circuit attributes storage module 209. For example, with the illustrated example, the circuit attributes storage module 209 may specify a minimum distance to be maintained between each of the blocks 303-325. The circuit layout determination module 207 will then identify when the block 319 has moved to within this minimum distance from the adjacent block 317. If the input wire constraints require the block 319 to move further towards the adjacent block 317, the circuit layout determination module 207 will move the adjacent block 317 away from the block 319 to maintain the specified minimum distance. Further, the movement of the adjacent block 317 may be displayed for the user in the user interface 301, as illustrated in FIG. 3B.

Similarly, the circuit layout determination module 207 will identify when the block 319 is moved to within a minimum specified distance from the adjacent block 321. If the input wire constraints require the block 319 to continue to move towards the adjacent block 321, then the circuit layout determination module 207 moves the adjacent block 321 away from the block 319 to maintain this specified minimum distance. Further, as the adjacent block 321 reaches its minimum specified distance from its adjacent block 323, the circuit layout determination module 207 moves the block 323 away from the block 321 to preserve the minimum distance separation between the two blocks. The movement of the adjacent blocks 321 and 323 also may be displayed for the user in the user interface 327, as also illustrated in FIG. 3B.

Different examples of the floor plan design tool 201 may allow the circuit attributes storage module 209 to specify any desired attributes for a floor plan design. For example, some implementations of the floor plan design tool 201 may allow the circuit attributes storage module 209 to designate different minimum or maximum distances between different blocks, and even to designate different minimum or maximum distances to be maintained on each side of a block. The circuit attributes storage module 209 may also specify a minimum or maximum distance to be maintained between two or more blocks. This type of attribute may be employed, for example, when blocks are related and should be positioned relatively close to each other.

The circuit attributes storage module 209 may alternately or additionally specify attributes relating to other features of the floor plan design, such as wire or guard band placement. For example, the circuit attributes storage module 209 may specify minimum or maximum wire widths or lengths, a maximum level of congestion permitted for wire routing, or a minimum or maximum distance between different types of wiring lines. Further, with some examples of the floor plan design tool 201, the circuit attributes storage module 209 may even specify that some wiring lines, such as a main power or ground network wires, are maintained a first minimum distance from a first type of block, and a second minimum distance from another type of block. This allows, for example, a power or ground network wire to be kept at a greater minimum distance from a block that is particularly sensitive to noise from that wire.

Figure 4A:
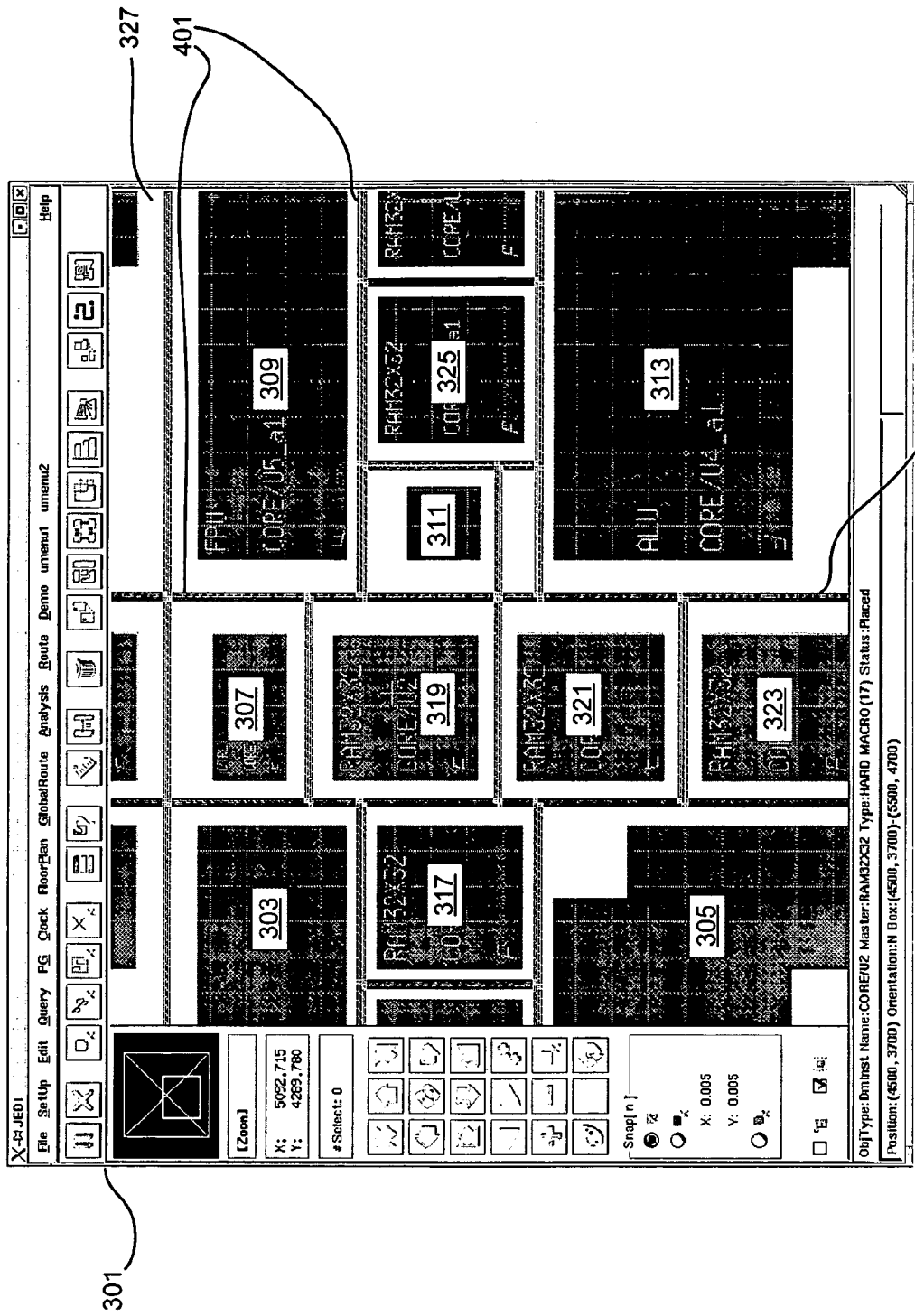

The user interface 301 may be configured to display only the positions of the blocks 303-325, as illustrated in FIGS. 3A and 3B. If, however, a user wishes to view one or more other features of the floor plan design, then the user may activate a command provided by the user interface to display the desired features. Such features may include power, ground, or signal wire routing, guard band placement, and a congestion map showing congestion for one or more types of wire connections. For example, as shown in FIG. 4A, the user interface generation module 205 may be instructed to have the user interface 301 display the routing of the power and ground network wires 401 for the floor plan design. That is, a designer may choose to have the user interface 301 display the portion of the floor plan design that includes the routing path of the power and ground network wires 401 for the current placement of the blocks 303-325.

As will be appreciated by those of ordinary skill in art, changing one or more features in a floor plan design may impact other features of the design, including design features that may be displayed by the user interface 301. For example, widening a power or ground wire may in turn require moving a block proximal to the widened power or ground wire. Accordingly, with various examples of the invention, the circuit layout determination module 207 may determine what impact the widening or narrowing of a wire may have on other features of floor plan design, and display these changes in the user interface 301.

Figure 4B:
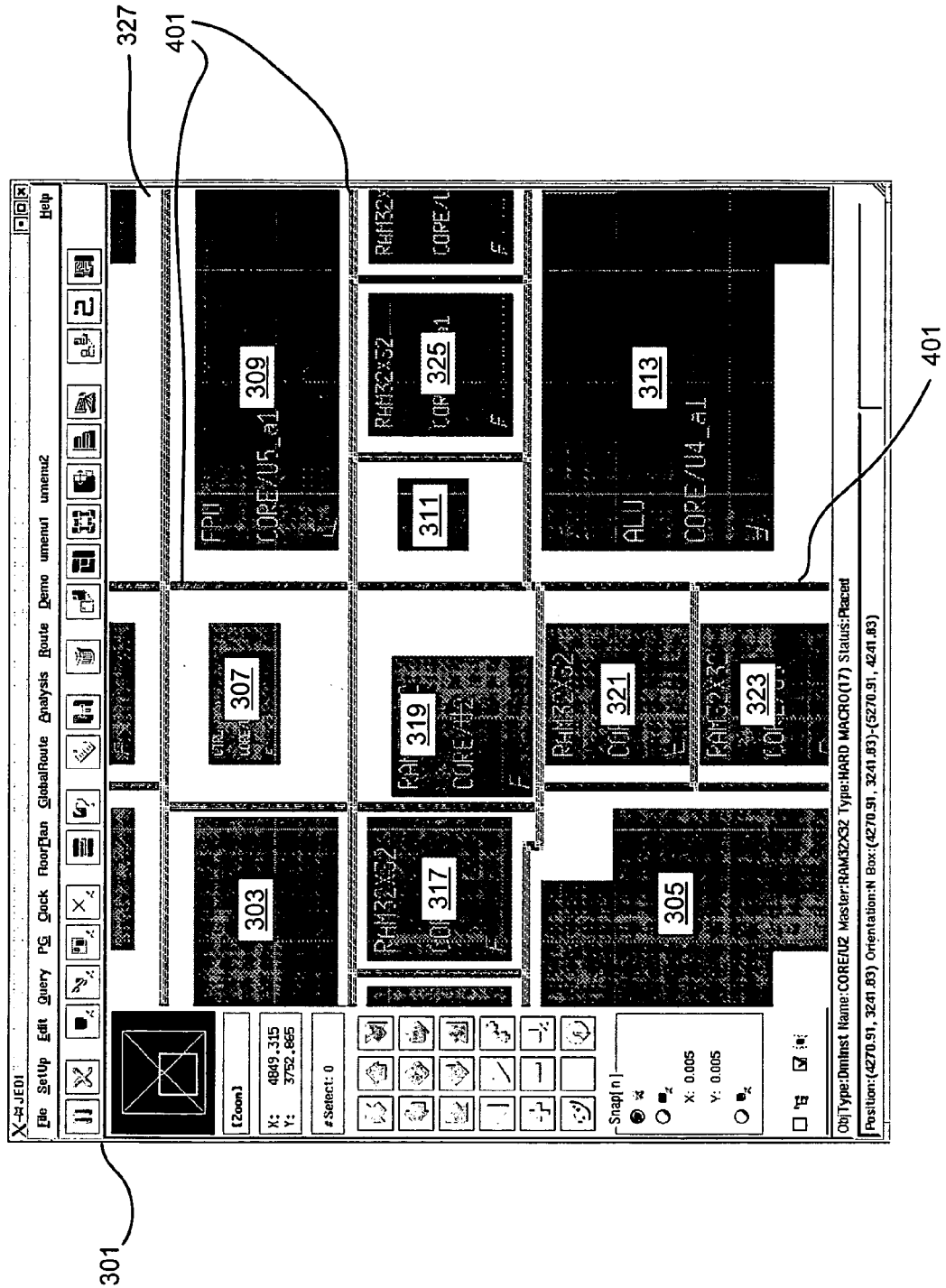

For example, by displaying the power and ground network wires 401 as shown in FIGS. 4A and 4B, the designer can view how movement of the block 319 (and the corresponding movement of the blocks 317, 321 and 323) changes the routing of the power and ground network wires 401 in the floor plan design. More particularly, the designer can determine that moving the block 319 will change the routing of the power and ground network wires 401 between the blocks 319 and 321, between the blocks 311 and 313, between the blocks 317 and 305, between the blocks 303 and 307, between the blocks 317 and 319, and between the blocks 321 and 323.

Thus, when block 319 is moved, the user can immediately view the effect of this movement on other features of the floor plan design. With some examples of the invention, the user interface 301 may additionally display features of the floor plan design that will change in response to rerouting of wiring connections. The user interface 301 may thus be configured to display the amount of congestion associated with a particular wire routing. For example, if the user interface 301 displays the routing for the main power and ground network wires 401, the user interface 301 may additionally indicate the level of congestion associated with these wires 401. If a portion of the main power and ground connection wires 401 are not congested, then the user interface 301 may display this portion, e.g., in a first color, such as green. If a portion of the power and ground network wires 401 are mildly congested, then the user interface 301 may display this portion in a second color, such as yellow. If a portion of the power and ground network wires 401 is heavily congested, then the user interface 301 may display this portion in still another color, such a red. A similar congestion indication scheme may then be used to indicate congestion for signal wires. Of course, any desired indication scheme, such as hatching or shading, alternately may be used to indicate relative congestion of power, ground and signal wires.

It also should be appreciated that different examples of the floor plan design tool 201 may evaluate the congestion of various wiring connections using any desired criteria, such as the number of different wires per area, placement of the wires within a threshold distance of each other, etc. Further, various examples of the invention may identify more or less than the three different levels of congestion as described above.

While wire congestion has been discussed as one example, it should be noted that various examples of the floor plan design tool 201 may display any desired characteristics of floor plan design features in the user interface 301. For example, as will be discussed in more detail below, the PG wire routing optimization tool may employ the user interface 301 to alternately or additionally show where wires in the floor plan design will suffer an undesired voltage (or "IR") drop or electromigration problem. With these examples of the invention, the user interface may, e.g., identify such drops with an "X" marking or other recognizable identifier.

With some examples of the floor plan design tool 201, the circuit layout determination module 207 may update one or more features of a floor plan design upon a movement of the blocks 303-325, regardless of whether those features contemporaneously are displayed by the user interface 301. With still other examples of the floor plan design tool 201, however, the circuit layout determination module 207 may determine the current status of features of the floor plan design only when those features are to be displayed by the user interface 301.

Also, with various examples of the floor plan design tool 201, other features of a floor plan design are determined only after a the placement of the blocks has been fixed. With still other examples of the floor plan design tool 201, however, these other features of the floor plan design may be determined and displayed to the user in real-time (i.e., as wire is widened or a block is moved). This type of immediate feedback allows a user to more quickly and naturally understand the changing placement for the blocks in a floor plan design, and to readily ascertain when movement of a block may reduce the performance or yield of a circuit.

In order to provide faster feedback to a user, various examples of the floor plan design tool 201 may employ one or more techniques to reduce processing overhead. For example, some examples of the floor plan design tool 201 may provide faster global routing for, e.g., signal wires, by simplifying the number of material layers represented in the routing determination. Thus, while a conventional microcircuit may actually use six to eight different layers of material for routing signal wires, a fast global routing process according to various examples of the floor plan design tool 201 may only assume that two layers exist for routing signal wires (e.g., one layer for carrying wires in a first direction, and another for carrying wires in a second direction orthogonal to the first direction). This provides a user with an indication of routing and congestion problems associated with block movements, without requiring a detailed determination of routing in all of the available connection layers.

Still further, the circuit layout determination module 207 may only determine global routing for wires, without determining local routing. In addition to reducing processing overhead, omitting local routing of wires may provide a user with a more accurate indication of the congestion associated with the wires. Still further, the process for determining the characteristics of a circuit may only be performed until new or further movement of a block is detected (e.g., until new data from the pointing device indicating movement of a block is detected). If the circuit layout determination module 207 detects that a block is being moved, then the circuit layout determination module 207 can postpone determining the design changes until the movement of each block is paused or completed.

Visibility Graph

Many features of a floor plan design, such as the routing of power, ground, signal and guard band wires, will depend upon relationships between the various blocks in the design. Accordingly, various examples of the invention may employ visibility graphs to describe geometric relationships between the blocks of a floor plan design. A visibility graph represents the relative locations of objects within a domain of interest, such as blocks within a floor plan design. More particularly, visibility graphs provide an efficient tool to quickly identify which block in a floor plan design is directly and indirectly "visible" to another block, as will be explained in detail below. Accordingly, a visibility graph can be used to determine, when a designer moves one block in a floor plan design, which of the other blocks will need to be moved as well (and which blocks cannot be moved due to various restrictions). A visibility graph also can be used to help quickly determine global routing for the main power, ground, signal and guard band wires.

With various examples of the invention, a complete visibility graph is made up of two directional visibility graphs, with each directional visibility graph being oriented according to a direction orthogonal to the direction of the other directional visibility graph. Thus, a complete visibility graph may be comprised of a "vertical" visibility graph (describing the "visibility" of the blocks to each other only in a vertical direction) and a "horizontal" visibility graph (describing the "visibility" of the blocks to each other only in a vertical direction).

Figure 5A:
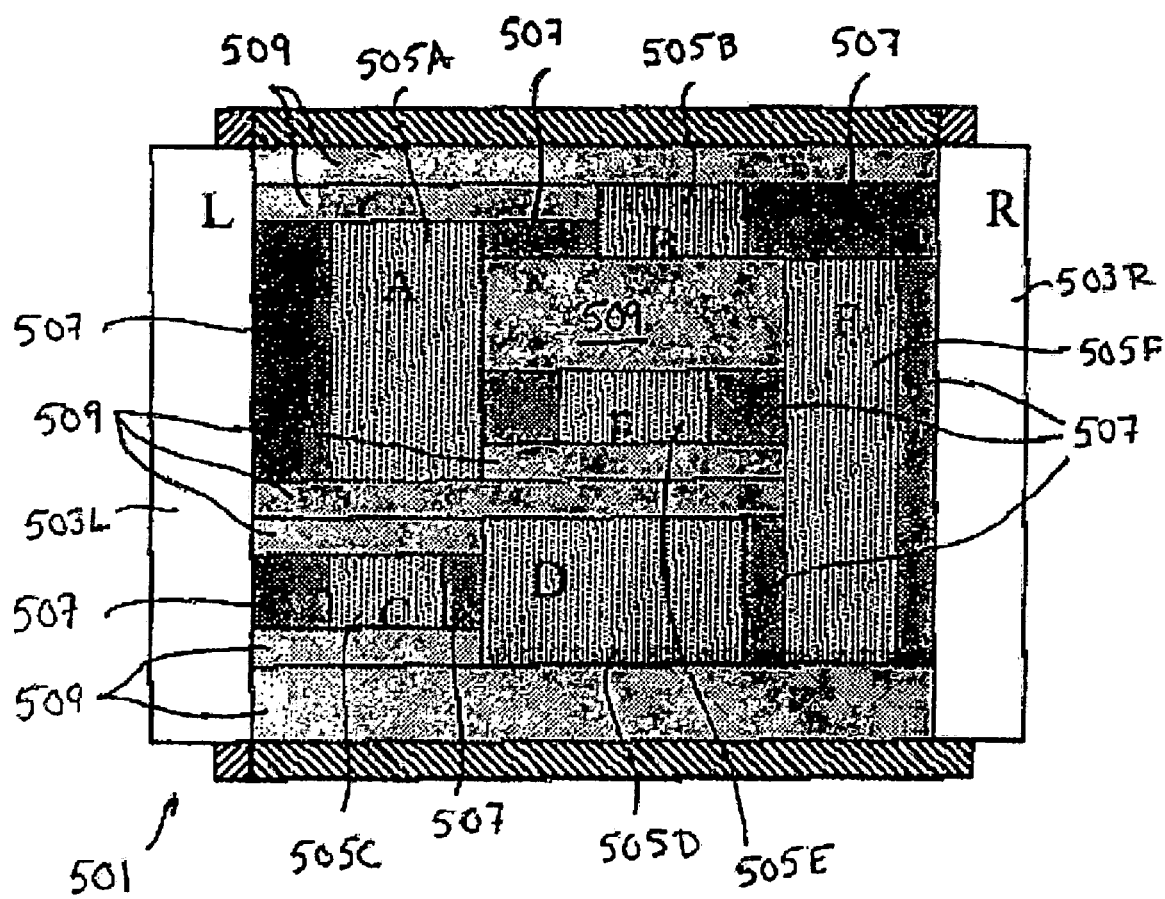
FIG. 5A illustrates an example of a floor plan design.

FIG. 5A illustrates an example of a floor plan design 501. The floor plan design 501 has a "left" side or boundary 503L, a "right" side or boundary 503R, and a number of different blocks 505A-505F. There also are a number of empty spaces (in this example, rectangular spaces) between the sides 503 and the blocks 505. As shown in this figure, however, these spaces can be categorized into two groups. The spaces 507 contact only two blocks 505, while the spaces 509 contact three or more blocks 505.

Figure 5B:
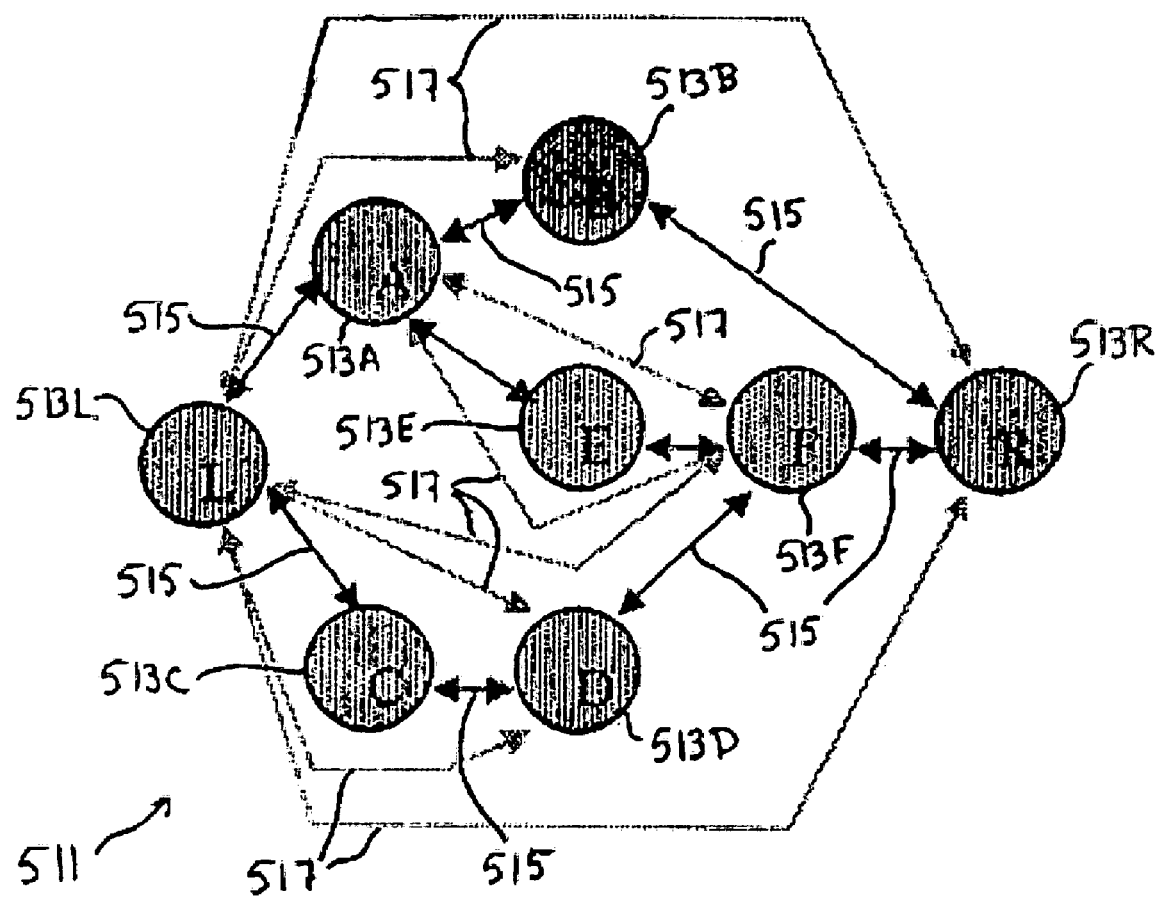
FIG. 5B illustrates a horizontal directional visibility graph corresponding to the floor plan design in FIG. 5A.

FIG. 5B illustrates a horizontal visibility graph 511 corresponding to the floor plan design 501 shown in FIG. 5A. As seen in this figure, each horizontal side 503 of the floor plan design 501 is represented by a node 513 in the graph 511. In addition, each block 505 in the floor plan design 501 also is represented by a node 513 in the graph 511. Thus, the node 513L corresponds to the left side 503L of the floor plan design 501, while the node 513R corresponds to the right side 503R of the floor plan design 501. Nodes 513A-513F then correspond to blocks 505A-505F, respectively.

An "edge" in the visibility graph corresponds to an empty rectangular space (in the graph's direction) between two blocks 505. An edge can be a primary edge or a secondary edge, however. An edge between two nodes X and Y is a secondary edge if and only if there exists another path from node X to node Y that contains at least one other node Z. That is, a secondary edge is an edge between two nodes where there exists a longer path (in terms of the total number of edges and nodes) between the same node pair. All other edges then are primary edges. Thus, the rectangular spaces 507 in the floor plan design 501 are represented by the primary edges 515, while the rectangular spaces 509 are represented by the secondary edges 517. Depending upon the arrangement of the blocks in a floor plan design, there may be two or more edges between the same pair of nodes. For instance, in the floor plan design 501, there are two empty rectangles of space between the blocks 505A and 505F, so there are two edges 517 between the node 513A and the node 513F. Such pairs of edges will not typically be merged.

A vertical directional visibility graph can then similarly be constructed for the floor plan design 501. The two directional visibility graphs will not be independent from each other, however. When one graph is modified due to the movement of a block, the configuration of the other visibility graph will need to be updated as well. Therefore, when a block in the floor plan design is moved, the two visibility graphs will be updated in an alternating fashion. With this alternating update sequence, corner-to-corner overlap of the visibility graphs can be avoided during incremental update and change. The determination of which directional visibility graph will be updated first may vary, however, depending upon the floor plan design. For example, a floor plan design may have more blocks (or more wire routing) in a horizontal direction, so it may be more efficient to update the vertical visibility graph for that floor plan design before updating the horizontal floor plan design.

As previously noted, various examples of the floor plan design tool 201 may be implemented with a programmable computing device executing software instructions. With these examples, the visibility graphs for a floor plan design may in turn be implemented using a data structure that is accessible to the programmable computing device. Because both the horizontal visibility graph and the vertical visibility graph for a floor plan design share a common set of nodes, the two directional visibility graphs can be merged into a single, "complete" visibility graph in such a data structure. With such a complete visibility graph, the edges may be grouped into vertical and horizontal edges. The complete visibility graph, however, will still distinguish between primary and secondary edges.

More particularly, a data structure implementing a complete visibility graph for a floor plan design may store four pointers to four nodes representing the four sides of the floor plan design. Other relevant information also may be stored in this anchor structure, such as a pointer to a duplicated or temporary visibility graph. A node in the data structure for the complete visibility graph will either represent a side of the floor plan design or a block within the floor plan design. Because a block may be rectangular or rectilinear, the node corresponding to a block will store a list of rectangles forming the block's boundary. Alternately, if the block has a polygonal shape, a node corresponding to that block may store a polygon as the block's boundary, but, as will be appreciated by those of ordinary skill in art, this node information requires additional processing steps to be useful.

As previously noted, a path between two blocks in the floor plan design is defined as an edge in the data structure describing the complete visibility graph. An edge connects exactly two nodes, and a primary edge in the data structure for a complete visibility graph represents the empty space between the two blocks corresponding to those nodes. As will be discussed in more detail below, this empty space serves as a channel area or channel "box" through which connection wires, such as power/ground network wires, can be routed. An edge in the data structure therefore will store the boundary of the rectangular area that it represents. Further, a primary edge will include some information identifying it as a primary edge, as opposed to a secondary edge. Edges corresponding to spaces on each side of a block may be sorted from bottom to top, and left to right.

With different examples of the floor plan design tool 201, a variety of functions or "client" operations may conveniently employ the information contained within the complete visibility graph for a floor plan design. For example, as noted above and as will be discussed in greater detail below, some examples of the floor plan design tool 201 will determine and display global routing for the power and ground network wires. Still other examples of the floor plan design tool 201 may enable client operations that determine and display global routing for the signal wires (such as critical or bus signal wires), pin assignments (for the blocks or the entire design), or any other desired feature of a microcircuit design. With various examples of the floor plan design tool 201, these client operations may be implemented both within and external to the elastic assembly floor plan design tool 201.

Accordingly, each node or edge in the data structure may contain a pointer to a linked list of client pointer holders. A client pointer holder consists of a pointer to the next client pointer holder, a client pointer and a signature of the pointer. When a client accesses its own client pointer, various examples of the invention may require the client to identify itself through a signature to use the completed visibility graph. This configuration allows each of the client operations to store and retrieve the values associated with the edges of the data structure for the complete visibility graph, thereby permitting the complete visibility graph to be shared among different client operations.

Wire Attributes

As discussed above, the floor plan design tool 201 is used by the PG wire routing optimization tool to determine and display various features of a floor plan design, including power, ground, signal and guard band wire routing. Accordingly, an example of the determination of power and ground network wires will now be described for illustration. The term "power and ground network" or "PG network," as used herein, refers to the primary power and ground wires that include the combination of core rings (i.e., one or more main power and ground wires that ring the core area) and block rings (i.e., one or more main power and ground wires that ring at least a portion of a block) used to supply a power and ground voltage to various blocks in the floor plan design.

As previously noted, the elastic assembly tool 201 may include a circuit attributes storage module 209 defining various attributes for the floor plan design. Thus, the circuit attributes storage module 209 may include attributes relating to the routing of the wires making up the power and ground networks. These attributes may, for example, dictate the width of the main power and ground wires, as will be explained in more detail below.

The circuit attributes the circuit attributes storage module 209 may include both global attributes and local attributes. Global attributes are universally imposed, while local attributes are imposed only for specific features of the design or within a specific region of the design. For example, global attributes for power and ground network wires will apply to all power and ground network wires in a floor plan design. A local attribute, however, will only be imposed on power and ground network wires that are proximal to a specific block or that are located within a specific region of the floor plan design.

With various examples of the floor plan design tool 201, the circuit layout determination module 207 may combine both the global and local attributes. For example, the circuit layout determination module 207 may first apply the global attributes, which typically are rule-driven, for all blocks. These rules could be placed in a text file and loaded into the circuit attributes storage module 209 as a group, entered on an individual basis through a user interface to the tool 201, or a combination of both. The circuit layout determination module 207 can then apply the local attributes so as to override the global attributes in the area of the appropriate blocks. Like the global attributes, the local attributes rules may be placed in a text file and loaded into the circuit attributes storage module 209 as a group, entered on an individual basis through a user interface to the tool 201, or a combination of both.

For wire routing, such as power and ground network wire routing, global attributes may be derived based upon any number of desired considerations, such as power consumption or block size. The attribute values for all blocks in a design can be entered into the circuit attributes storage module 209 as a group, or entered on an individual basis through a user interface. Once the specific attributes are defined, the circuit layout determination module 207 can repetitively reconstruct a main power and ground wire network very quickly after every major or minor adjustment of block placement using the visibility graph for the floor plan design.

For example, some implementation of the floor plan design tool 201 will employ specific power consumption values for a block. These attributes values may then be employed with a designated watt-per-micron-width value, which defines how much power a given width of a wire can provide or dissipate while staying within a desired temperature range. With various examples of the floor plan design tool 201, the watt-per-micron-width value may be designated in advance or alternately provided by a user of the tool 201, either through an attribute file or through a user interface for the tool 201. Using these attributes, the circuit layout determination module 207 can easily determine the minimum required width of the power and ground network wires around each block. Further, by assuming that the first preferred metal layer for each orthogonal wire direction is the default layer, as discussed above, the circuit layout determination module 207 also can calculate the desired wire widths and layer placement for the power and ground network wires relative to all sides of all blocks that have power and ground input pins.

It should be noted that, when using a power consumption attribute value for an entire block, the calculated width for the power and ground network wires would be divided by number of sides of the block that contain pins of specific number of power and ground circuits. Accordingly, various examples of the floor plan design tool 201 may designate the attributes in the circuit attributes storage module 209 as:

SetBlockPowerConsumption <masterName> <powerWatts>
. . .
SetPGMicronPerWattRatioByNet <netName> <micronPerWatt>
/* <netName>="*" for all PG nets */ where <masterName> is the name of the block for which the attribute is being set, <powerwatts> is the designated power consumption for that block, <netName> is the name of the power/ground network for which the wire length is being determined, and <micronPerWatt> is the amount of power (per unit) that a given width of a wire line will dissipate or provide while remaining within a desired temperature range.

If only a subset of blocks in a design have associated power consumption data, the circuit layout determination module 207 may interpolate or extrapolate power consumption based on the dimension of the blocks when compared with the power consumption data and the dimensions of the blocks having associated power consumption data. Using this interpolated or extrapolated power consumption data, the circuit layout determination module 207 can easily determine a wire width for power/ground network wires proximal to blocks that do not have associated power consumption data.

If power consumption attribute values associated with blocks are not readily available for use, various examples of the invention may alternately or additionally allow for the use of dimension-based attributes. For example, some implementations of the floor plan design tool 201 may provide a command allowing a user to submit a number reflecting the power and ground network wire width per area unit for an associated block, such as:

SetPGMicronPerBlockArea <micronPerArea>

With this type of designation, the field <micronPerArea> may be in a <micron>*<micron> unit. Using this attribute, the circuit layout determination module 207 can calculate the required main power and ground network wire widths for all sides of a block based upon the total area of the block.

Some examples of the floor plan design tool 201 may even allow for mixed use of both power consumption attribute values and dimension-based attribute values as global attributes. When in conflict, for example, some examples of the floor plan design tool 201 could designate that a power consumption based attribute would take precedence over a dimension-based attribute.

Because power and ground network wires forming "core" rings are very common and typically cannot be derived from power consumption data or even dimension data for blocks, various examples of the floor plan design tool 201 may additionally allow the widths and layer assignments of power and ground network wires to be specified. For example, some examples of the floor plan design tool 201 may allow a user to specify the direction, layer and width of a core ring wire using a command such as SetPGCoreRingWidth <netName> <direction> <layer> <width> where <netName> is the name of the power/ground network forming a core ring, <direction> specifies the direction in which the wire is oriented (e.g., horizontal or vertical), <layer> is the layer of material in which the wire will be formed, and <width> is the width of the wire.

With this type of command, a "wildcard" character (such as the "*" character) could be used to represent all applicable matches in the <netName> and <direction> fields, thereby allowing the command to be used to simultaneously designate the attributes of multiple core ring power/ground network wires. The <netName> could either specify a power or ground network. If a power/ground network serving as a core ring does not have a specified associated core ring attribute, then the circuit layout determination module 207 may simply exclude the automatic determination of the routing for that power/ground network. With various examples of the floor plan design tool 201, an attribute for a power/ground network serving as a core ring may override any other attributes imposed on the same area of the floor plan design, such as an attribute corresponding to a block when the block is located adjacent to the core ring.

As previously noted, local attributes typically will override global attributes. Local attributes normally will be associated with a set of one or more specific blocks, and in some uses, with directional attributes that can be used to designate one or more specific sides of a block. Thus, a block-based attribute may be employed to direct construction of wiring routes next to a specific side of the block. The direction/side specification may be relative to the associated block's normal orientation or transformation, making the attribute rotation independent. Various examples of the floor plan design tool 201 may thus provide commands such as SetBlockPGAttribute <blockname> <side> <attributeName> <value> to designate a local attribute. With this command example, the field <blockName> is an instance name for the attribute (i.e., associating the attribute with a specific block), and not a master name since it is a local attribute. The field <side> may allow, for example, a value selected from the group of TOP, BOTTOM, LEFT, RIGHT, while the value of the <attributeName> field may be any one or more of a desired set of attributes associated with a side of block.

These attributes may include, for example, such parameters as a "reserve" value to reserve extra space in microns, a "noLessThan" value to specify that the wire be offset from the corresponding block by no less than a designated space in total, an "equal" value designating that the wire be a distance from the corresponding block by a space exactly equal to a specified value, a "width" value designating the width of all of the power/ground network wires for the associated side of a block, a "layer" value specifying the metal layers in which the power/ground network wires will be routed, and a "pinReserve" value specifying that at least the designated space be left between the power/ground network wire route and a boundary to protect pin accessibility. With the "pinReserve" attribute, the default value may be some minimal spacing distance plus some adjustment if space in the design allows. As will be appreciated by those of ordinary skill in the art, a "wildcard" character (e.g., an "*") can be used to designate all possible selections.

In some situations, two local attributes may conflict. For example, if a block A is located to the "left" of block B by a distance of 100 microns and a power/ground network wire running between the blocks has a width of 12 microns, the following two local attribute attribute commands (with values given in microns) will present a conflict:

SetBlockPGAttribute A RIGHT equal 40.0
SetBlockPGAttribute B LEFT noLessThan 50.0 since a wire with a width of 12 microns cannot be both 40 microns from the block A and no less than 50 microns from the block B.

When two attributes conflict, any desired technique may be used to resolve the conflict. For example, with a wire width attribute conflict, various examples of the invention may employ an average of the two attribute values, in order to minimize a maximum violation of the attributes. For a space attribute conflict, various examples of the invention may employ an average of the two attribute values, in order to minimize a maximum violation of the attributes. With a conflict of layer attributes, various examples of the invention may simply designate the lowest specified layer.

Some examples of the floor plan design tool 201 may allow local attributes to be designated for a group of two or more blocks. This feature may be useful, for example, where the attributes are used to route wires around a group of blocks so as to form a guard band. This feature may also be used to create power/ground network rings around a group of blocks. For example, various examples of the floor plan design tool 201 may provide commands such as SetBlockToGroup <blockName> <groupName> which designates the block specified by <blockName> as a member of the group specified by <groupName>, SetGroupNets <groupName> {<netName>} which associates an existing wire network with the group of blocks, and

SetGroupPGAttributes <groupName> <side> <attributeName> <value> where <groupName> specifies the group of blocks, <side> designates the side of the group to which the attribute will be applied, <attributeName> specifies the type of attribute and <value> specifies the value of the attribute. If, for example, a specified network is a "dummy" network (i.e., a network with no defined pin connections), then the network will be treated as a guard band formed around the group of blocks.

With some examples of the floor plan design tool 201, a local group attribute may be imposed on a block in or near the group that has a conflicting attribute. Alternately or additionally, some examples of the floor plan design tool 201 may resolve a conflict between a local group attribute and a local attribute associated with a block in or near the group. For example, if a local group attribute is being applied to a wire network serving as a power wire network (i.e., a "VDD" or direct-current voltage at drain wire network), and a block positioned near the group specifies a conflicting attribute for a wire network serving as a power wire network for that block, then the two power wire networks may be merged into a single power wire network large enough to comply with both attributes.

Under some circumstances, various levels of attributes may conflict. For example, a group based attribute may conflict with a local attribute for a single block, which in turn may conflict with a global attribute. Various examples of the floor plan design tool 201 may resolve these conflicts according to any desired technique. For example, some examples of the floor plan design tool 201 may resolve attribute conflicts in favor of the highest precedence according to the following descending precedence hierarchy:

Group-based attributes, such as guard band width, spacing, side, layer, networks Local attributes, such as block-specific width, spacing, side, layer Global attributes, such as power consumption parameter-based width/spacing determinations, dimension-based width/spacing determinations, macro-type based attributes (i.e., attributes generally assigned to analog blocks or generally assigned to digital blocks), and general default parameters.

It should be appreciated that, with various examples of the floor plan design tool 201, the attributes defined in the circuit attributes storage module 209 may only be employed for automatic construction of a main power and ground wire network. With some examples, a user may choose to manually edit a power/ground wire network or other wire routing. With these examples, the user interface 301 may offer a conventional set of commands (core ring, block ring, stripe) to modify the wire routing in the floor plan design.

Creation Of Wires

Figure 6A:
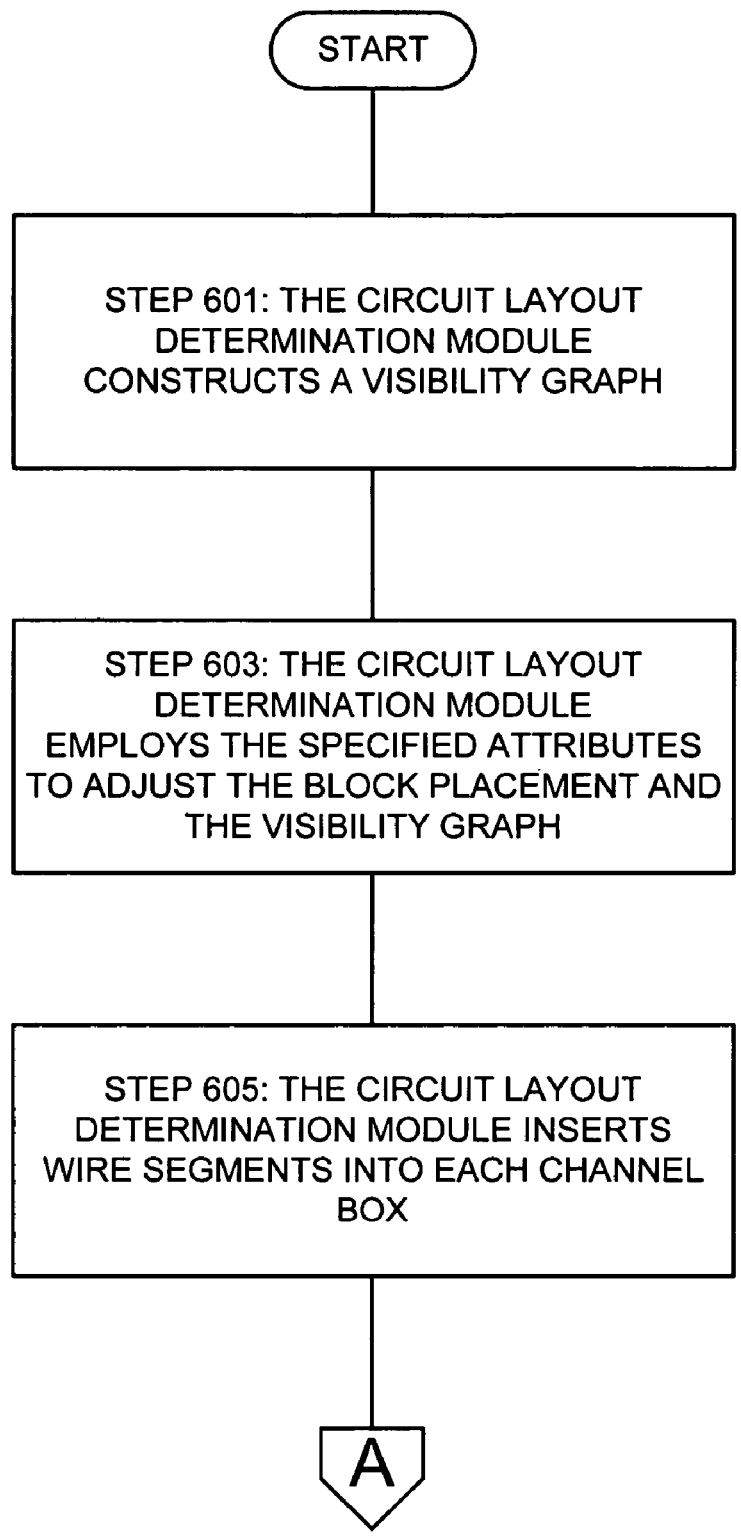
FIGS. 6A-6C illustrate a PG wire routing process of a floor planning tool that can be used with a PG wire routing optimization tool according to various embodiments of the invention.
Figure 6B:
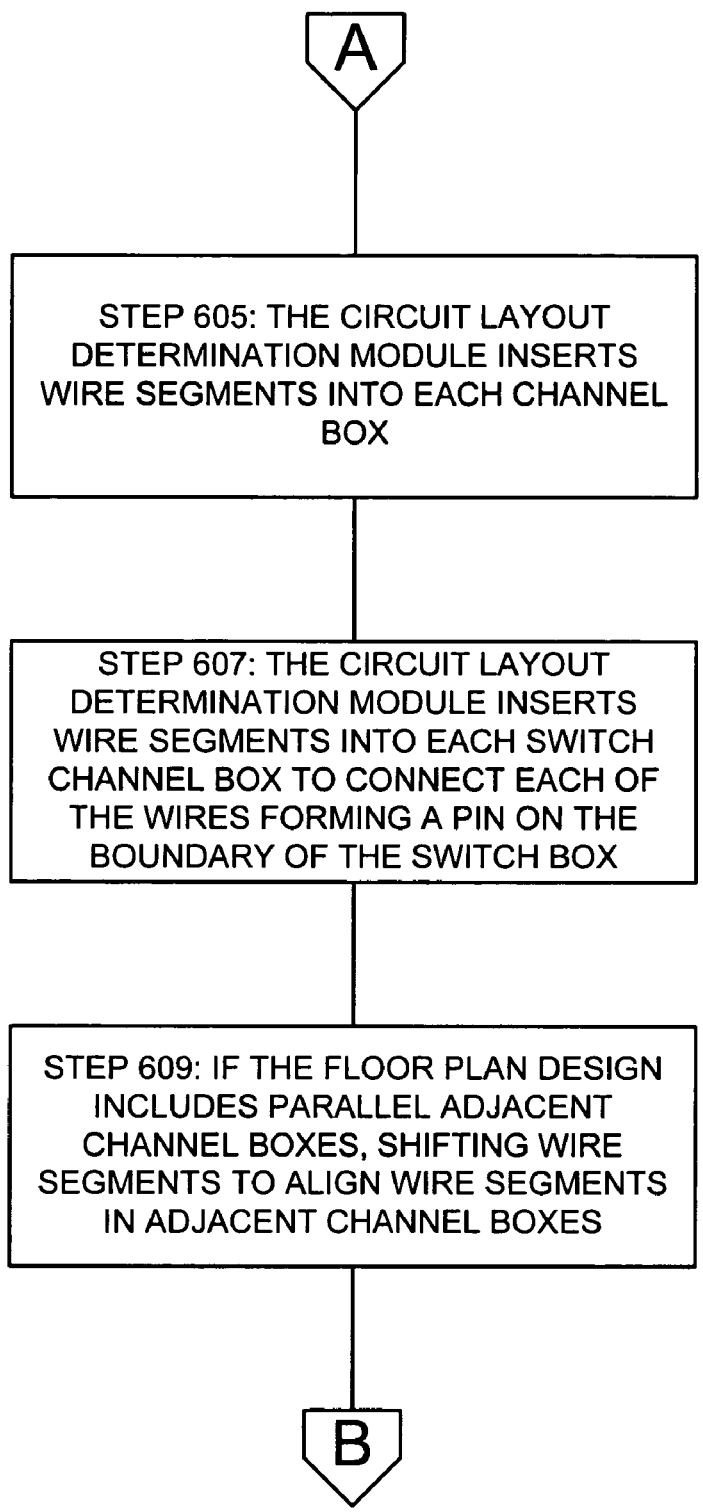
Figure 6C:
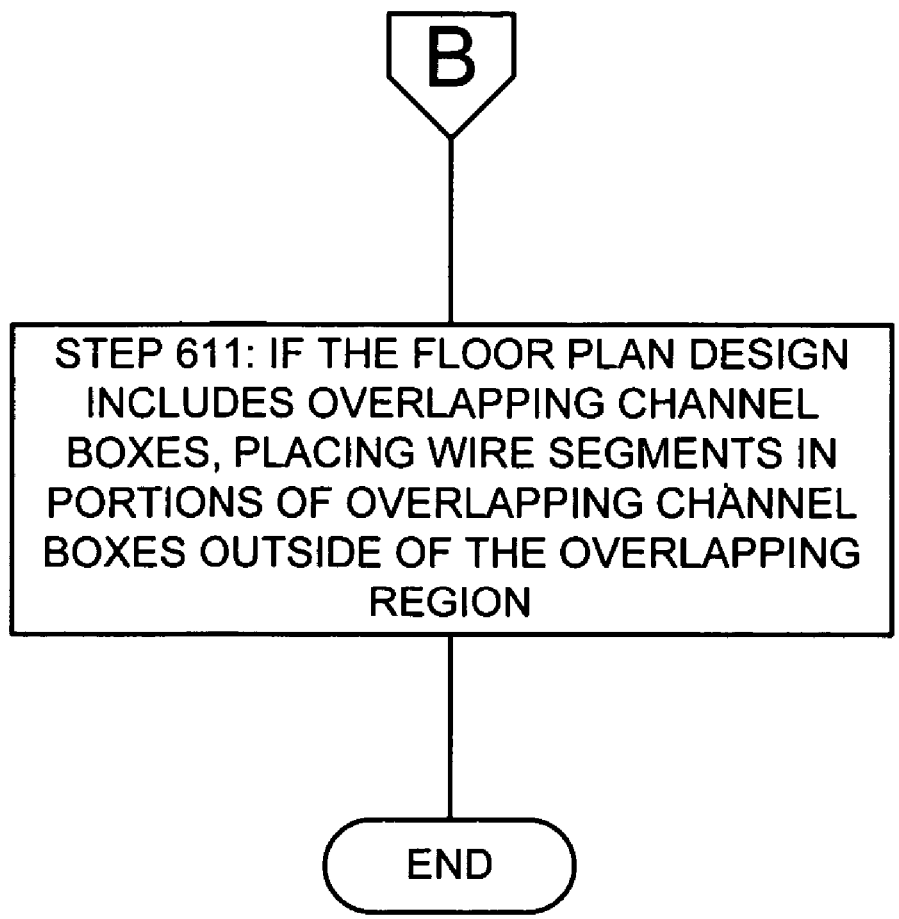

With various examples of the floor plan design tool 201, the circuit layout determination module 207 may employ a multi-step algorithm to automatically determine the routing of a wire network, such as a power/ground wire network. This algorithm may include, for example, (1) the construction of a visibility graph corresponding to the current arrangement of the floor plan design, (2) wire segment insertion into the design, (3) initial construction of the wire routing, and, (4) refinement of the wire routing. This algorithm will be discussed in more detail below, and is illustrated in FIGS. 6A and 6B.

Given a block placement without any overlap among blocks, using the desired global and local attributes for the block placement, the circuit layout determination module 207 first constructs a visibility graph in step 601 as described in detail above. Because the visibility graph construction process can be implemented very quickly, there typically is no need for an incremental update of the graph for changes to the floor plan design. Instead, the visibility graph may be reconstructed even after minor placement changes in the floor plan design, which serves to increase the stability of tool 201. It should be noted that, in some situations, an incremental update of an existing visibility graph may be more complex and time consuming than a total construction of a new graph. Some examples of the invention, however, may still incrementally update an existing visibility graph for changes in a floor plan design.

Once a visibility graph is constructed, the circuit layout determination module 207 will employ the specified attributes to adjust the block placement (and thus the visibility graph) in step 603. This process may include, for example, adjusting the size of the channel boxes (i.e., the "box" formed by the channels of empty area between the blocks, as previously noted) to ensure enough space has been reserved for introduction of the power and ground network wires into channel boxes. These adjustments may be made based upon the network routing attributes provided in the circuit attributes storage module 209. For example, the attributes for a network may require a wire width of 10 microns, a distance between the wire and a block A of 40 microns, and a distance between the wire and a block B of at least 50 microns. With these attributes, the circuit layout determination module 207 may move the blocks A and B to ensure that they are separated by at least 100 microns (i.e., to ensure that the channel box has a width of 100 microns so as to comply with the specified attributes).

After a visibility graph has been successfully constructed and the channel boxes have been modified to ensure that there is enough space for wire segments, in step 605 the wire segments are inserted into each channel box. More particularly, if a channel box corresponds to a horizontal primary edge in the visibility graph, then a vertical wire segment is inserted into the channel box. Similarly, a horizontal wire segment for each needed power and ground network is inserted into each channel box corresponding to a vertical primary edge in the visibility graph. As discussed in detail above, the width of the inserted wire segment is calculated based upon the applicable attributes for that channel box, and the wire is assigned to a wire layer corresponding to the power or ground network to which the wire will belong. It should be noted that, when desired, a designer may impose local attributes to partially or completely rid a channel box of a wire segment.

When this process is completed, the channel boxes corresponding to the primary edges of the complete visibility graph contain inserted wire segments. The length of each wire segment typically will equal the height or width of the channel box, depending upon whether the wire segment is horizontal or vertical. Also, the center of each wire segment typically will be located at the center of its corresponding channel box. In some floor plans, a channel box will border a block belonging to a group associated with one or more group-based attributes (such as the type that may be used to create guard band wires). The circuit layout determination module 207 tests the channel box at each side of every block in such a group to ensure that the channel boxes surrounding these blocks comply with the attributes for the group.

Figure 7:
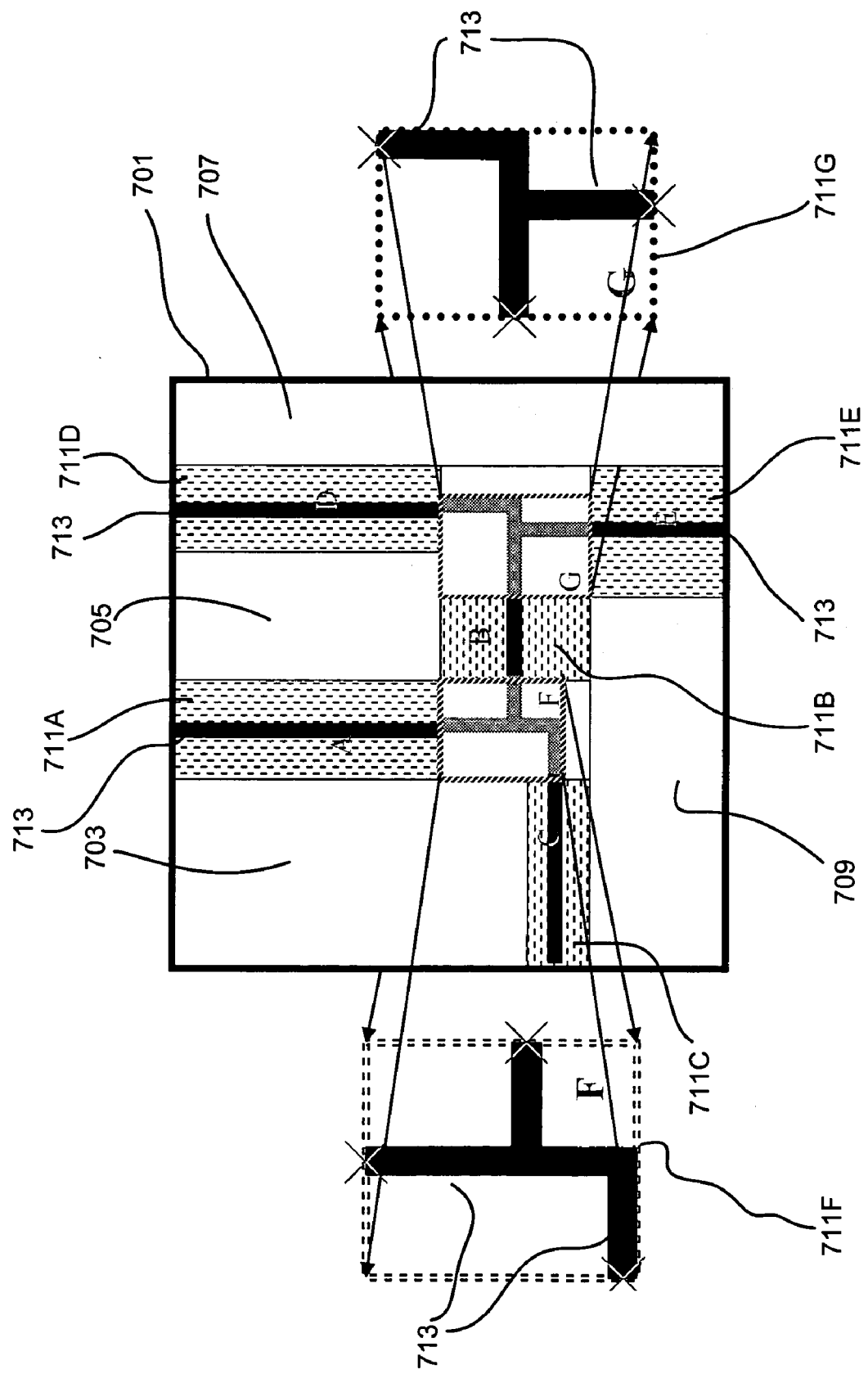
FIG. 7 illustrates a floor plan design having wire segments inserted into channel boxes between blocks.

After the insertion of wire segments into all of the channel boxes (except for those excluded from receiving a wire segment by one or more attributes) has been completed, the floor plan design contains interweaved wire segments. For example, as shown in FIG. 7, the floor plan design 701 includes blocks 703-709, with box channels 711 between various blocks. For example, a horizontal box channel 711A is located between block 703 and 705, while another horizontal box channel 711D is located between block 705 and block 707. Still another horizontal box channel 711E is located between block 707 and block 709. Vertical box channel 711B is then located between block 705 and block 709, and vertical box channel 711C is located between block 703 and block 709. As shown in this figure, a wire 713 is inserted into each channel box 711.

The intersection of channel boxes 711 forms "switch" channel boxes (i.e., areas where the direction of the wires 713 switch) or switch boxes. For example, the intersection of channel box 711A, channel box 711B, and channel box 711C form the switch box 711F (shown enlarged at the right-hand side of FIG. 7). Similarly, the intersection of channel box 711B, channel box 711D and channel box 711E form the switch box 711G (shown enlarged at the left-hand side of FIG. 7). Thus, the wire segments in the channel boxes 711 form pins on the boundaries of the switch boxes. The area of the switch boxes may be further defined to be the minimal area containing pins (i.e., connections) to wires in the channel boxes 711. In step 607, connection wires are formed within each switch box to connect each of the wires forming a pin on the boundary of that switch box. (It should be noted that, while FIG. 7 does not illustrate each the wires in the switch boxes 711F and 711G as being fully aligned with its corresponding pin, in actuality each wire segment within a switch box would be accurately aligned with its corresponding pin.) The routing of these connections wires within a switch channel box may be made according to any desired conventional technique. For example, various implementations of the floor plan design tool 201 may employ automatic area-based routing techniques, point-to-point routing techniques, and pattern-based routing techniques to route the wires within the channel boxes. These routing techniques are well known in the art, and thus will not be discussed in detail here.

When the components of a floor plan design are actually physically constructed, wires running in a vertical direction are usually formed in one or more different metal layers from wires running in a horizontal direction. Accordingly, some examples of the floor plan design tool 201 may replace joints between differently directed wires with a 'contact array' (i.e. array of contacts or vias) during the wire routing process. Wires associated with group-based attributes, such as wires forming a guard band, also can be connected in this way.

Figure 8:
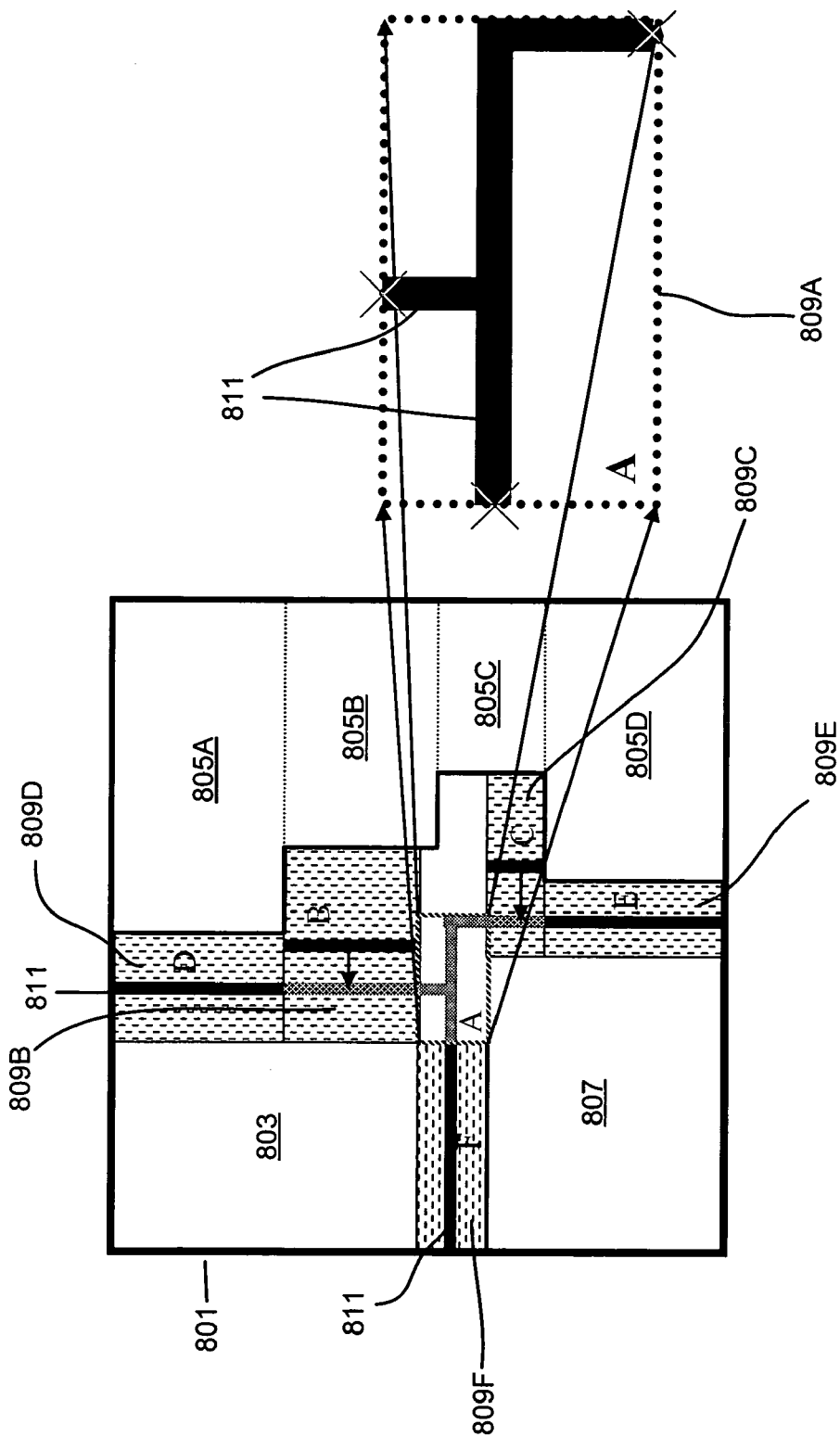
FIG. 8 illustrates the routing of PG wire segments in a floor plan design having a rectilinear block.

The routing process described above and illustrated in FIGS. 6A and 6B would be complete if all of the blocks within a floor plan design are rectangular and the channel boxes do not overlap. However, there are two special cases in which one or both of these conditions do not occur. An example of the first case is shown in FIG. 8. As seen in this figure, the floor plan design 801 includes blocks 803-805, but the shape of rectilinear block 805 is represented by a set of differently-sized rectangles 805A-805D. During the construction of a corresponding visibility graph as described above, the graph would have no edges among the rectangles 805A-805D of the same block 805. In other words, internal edges having the same 'node' on both ends of the edge (i.e., edges between the same block) would typically not be permitted in the visibility graph. Thus, the visibility graph for a floor plan design with a rectilinear block as shown in FIG. 8 would include parallel edges adjacent to one another. The floor plan design represented by such a visibility graph would correspondingly have parallel channel boxes adjacent to one another (i.e., not separated by a channel box running in a different direction so as to form a switch channel box), such as the adjacent channel boxes 809B and 809D and adjacent channel boxes 809C and 809E.

As seen in FIG. 8, after the initial construction of the wire segments 811 in the channel boxes 809B-809F, the wire segments 811 in adjacent channel boxes 809B-80D appear 'fractured' at the boundaries of the channel boxes 809B-809D. Various examples of the floor plan design tool 201 may address this discrepancy by shifting the wire segment in one channel box to connect to the wire segment in an adjacent channel box in step 609. For example, with the floor plan design illustrated in FIG. 8, the wire segment 811 in channel box 809B is shifted to align with the wire segment 811 in channel box 809D. Similarly, the wire segment 811 in channel box 809C is shifted to align with the wire segment 811 in channel box 809E. After the shifting process is complete, a switch box 809A is formed, and connecting wire segments can be routed in the switch box 809A as previously described in detail.

Figure 9:
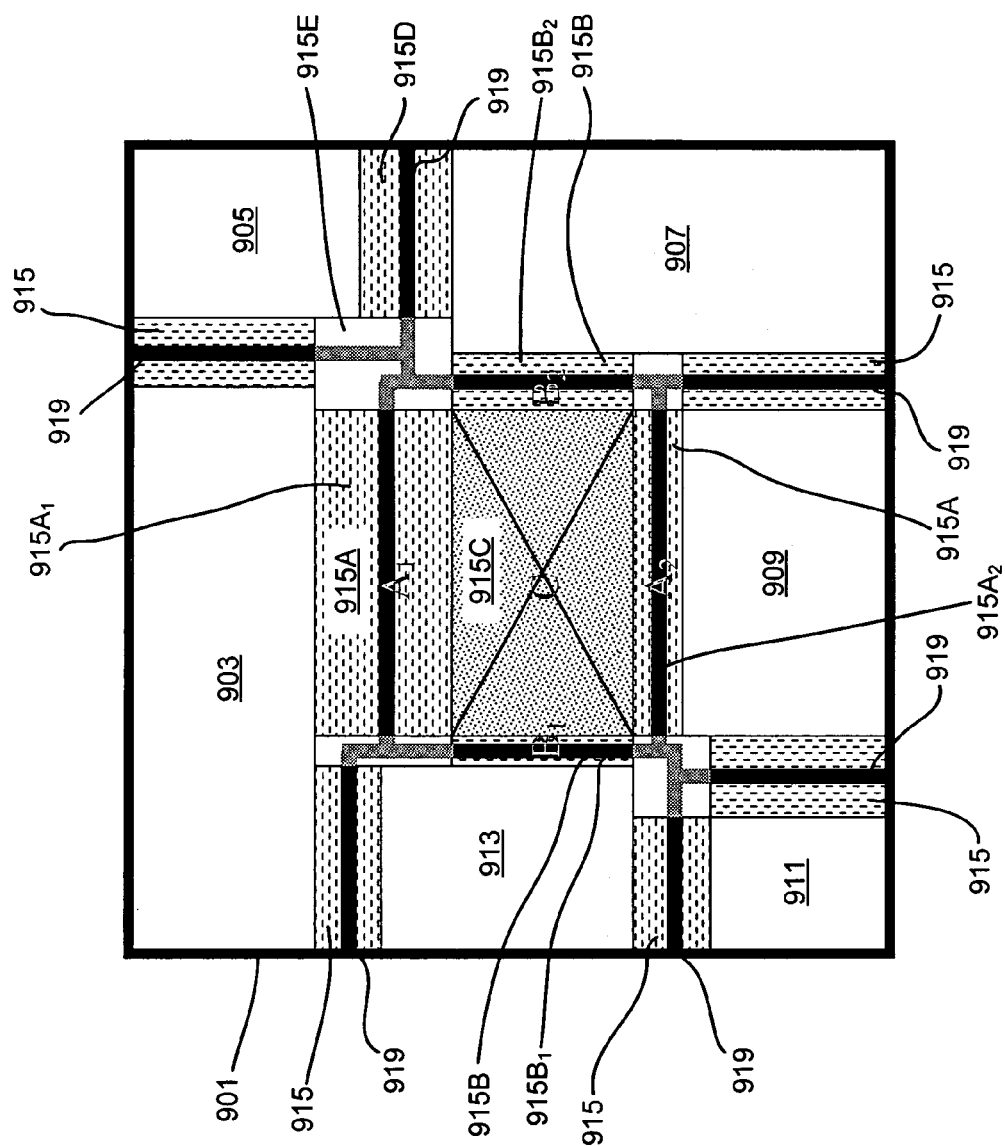
FIG. 9 illustrates the routing of PG wire segments in a floor plan design having overlapping channel boxes.

In some floor plan design configurations, the channel boxes could actually overlap one another. For example, as shown in FIG. 9, a floor plan design 901 includes blocks 903-913, with a channel box 915 formed between each pair of adjacent blocks. Additionally, a vertical channel box 915A is formed between block 903 and block 909, while a horizontal channel box 915B is formed between block 907 and block 913. As a result, the vertical channel boxes 915A and 915B intersect in rectangle 915C.

To avoid inadvertently creating shorts between wire segments in overlapping channel boxes, in step 613 various examples of the floor plan design tool 201 may route wire segments in those portions of overlapping channel boxes outside of the overlapped region. For example, in FIG. 9 the rectangular overlapping region 915C effectively segments the vertical channel box 915A into a channel box portion 915A$_1$ and a separate channel box portion 915A$_2$. Similarly, the rectangular overlapping region 915C divides the horizontal channel box 915B into a channel box portion 915B$_1$ and a separate channel box portion 915B$_2$. Thus, various examples of the floor plan design tool 201 will insert two wire segments into both channel boxes 915A and 915B instead of one. More particularly, the circuit layout determination module 207 will insert a wire segment 919 into the channel box portion 915A$_1$ and another wire segment 919 into the channel box portion 915A$_2$. Similarly, the circuit layout determination module 207 will insert a wire segment 919 into the channel box portion 915B$_1$ and another wire segment 919 into the channel box portion 915B$_2$. The routing within each resultant switch box (i.e., the switch channel boxes formed by the segmented channel box portions) can then be performed as previously described.

In some instances, this type of wire routing technique may produce redundant wire segments. With various examples of the floor plan design tool 201, any redundant wire segments can be prohibited or removed by designating appropriate local attributes. For example, with the floor plan design shown in FIG. 9, a user may determine that the wire segment routed through the channel box portion 915B$_1$ is redundant in view of the wire segment routed through the channel box portion 915B$_2$. The user can thus address this redundancy by setting the local attributes to prohibit or remove the wire segment routed through the channel box portion 915B$_1$.

PG Wire Routing Optimization Tool

Figure 10:
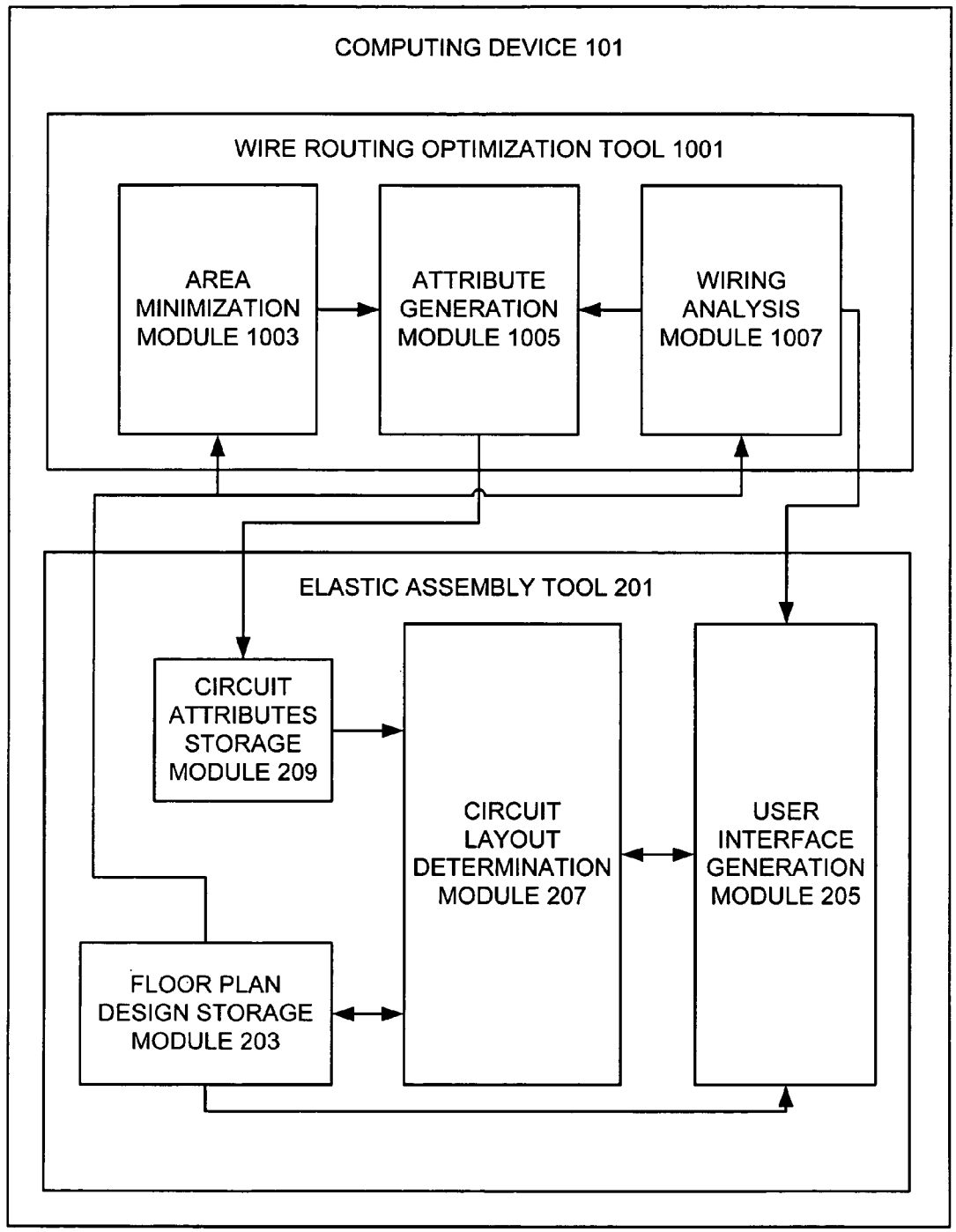
FIG. 10 illustrates an example of a PG wire routing optimization tool according to various examples of the invention.
Figure 11A:
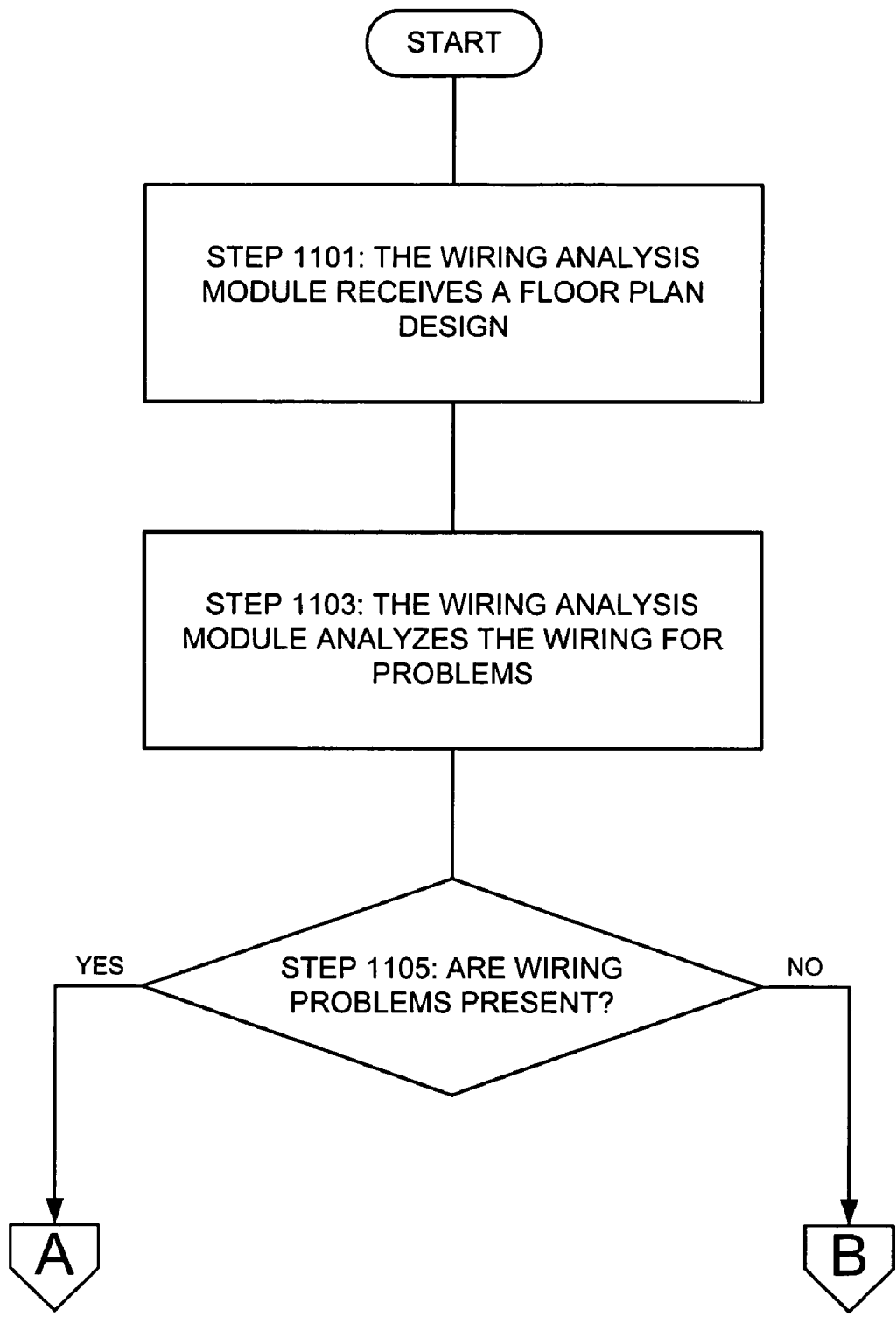
FIGS. 11A-11C illustrate the operation of a PG wire routing optimization tool according to various examples of the invention.
Figure 11B:
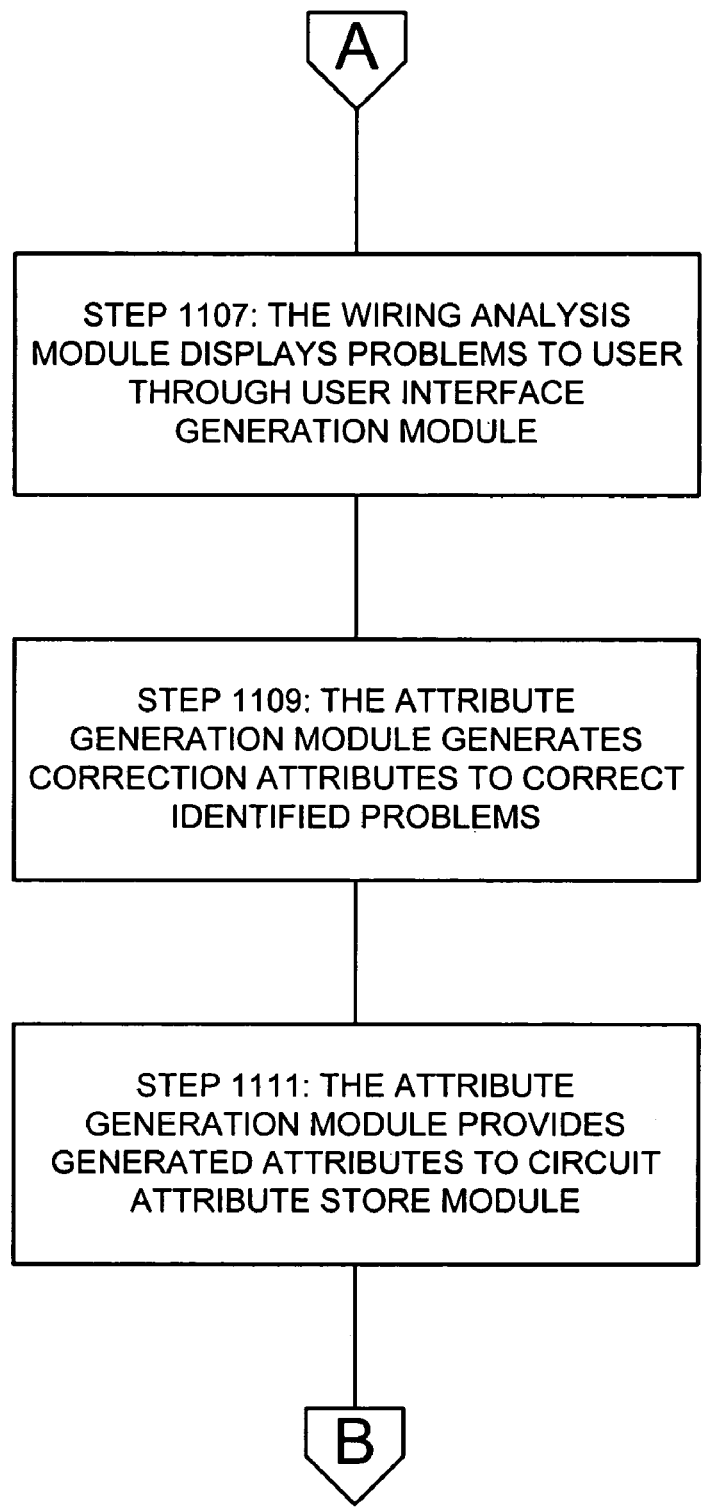
Figure 11C:
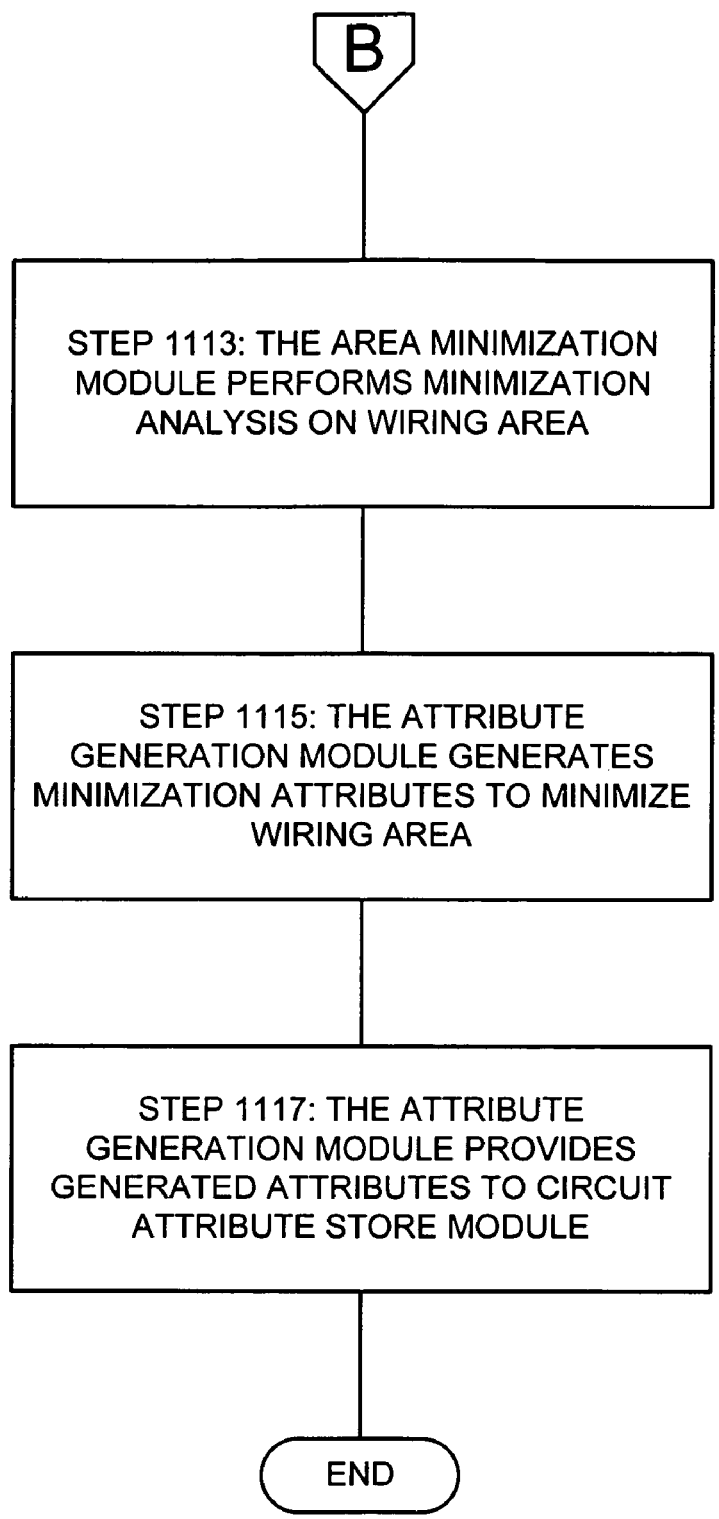

FIG. 10 illustrates an example of a PG wire routing optimization tool 1001 that may be implemented according to various embodiments of the invention. As seen in this figure, the PG wire routing optimization tool 1001 includes an area minimization module 1003, an attribute generation module 1005 and a wiring analysis module 1007. Each of these modules 1003-1007 may be implemented by software instructions operating on a computer, such as the computer 101. With various examples of the invention, the PG wire routing optimization tool 1001 may be implemented by the same computer 101 as the floor plan design tool 201. With alternate examples of the invention, however, the PG wire routing optimization tool 1001 and the floor plan design tool 201 may be implemented on separate computers, or even by a group of computers working together. The operation of the PG wire routing optimization tool 1001 will be described with reference to the process shown in the flowcharts illustrated in FIGS. 11A-11C.

Figure 12A:
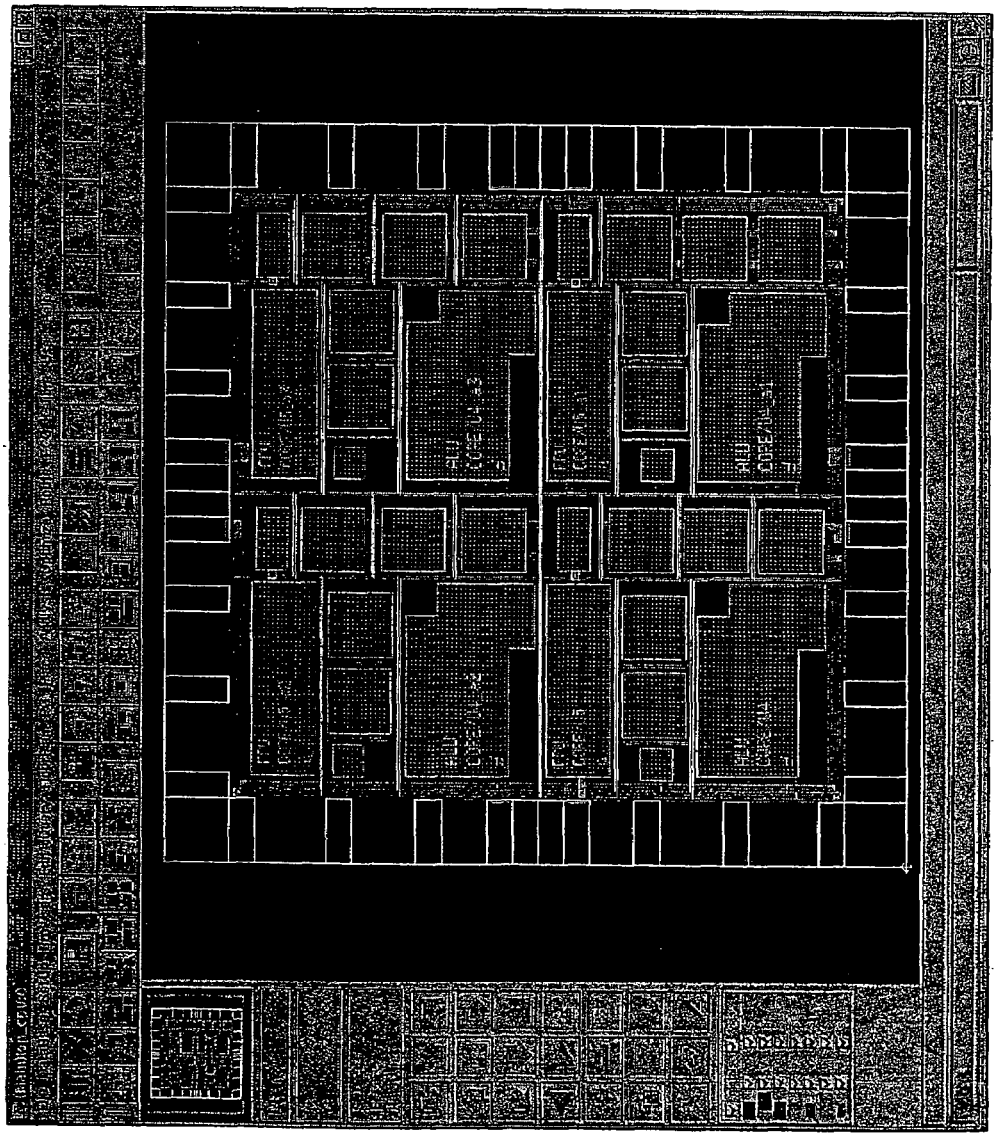
FIGS. 12A-12D illustrate examples of floor plan layouts that may be provided in user interface by a PG wire routing optimization tool according to various examples of the invention.

Initially, in step 1101, the PG wiring analysis module 1007 receives a floor plan design for analysis. In the illustrated example, the PG wiring analysis module 1007 receives the floor plan design from the floor plan design storage module 203 of the floor plan design tool 201. With other examples of the invention, however, the PG wiring analysis module 1007 may alternately or additionally receive a floor plan design from another source, such as a database specified by a user or input received directly from a user. Also, with various examples of the invention, the PG wiring analysis module 1007 may display the received floor plan design to the user, as shown by the floor plan design 1201 in FIG. 12A.

Next, in step 1103, the PG wiring analysis module 1007 analyzes the wire routing for the received floor plan design 1201 to determine if the PG wiring in the design 1201 includes one or more types of problems. For example, with various implementations of the invention, the PG wiring analysis module 1007 examines the PG wire routing in the received floor plan design 1201 to identify IR-drop problems or electromigration problems, as will be discussed in more detail below. Of course, still other implementations of the PG wire routing optimization tool 1001 may analyze the wire routing in the received floor plan design 1201 for any desired types of problems. In step 1105, the PG wiring analysis module 1007 determines if any such problems are present in the wire routing for the received floor plan design 1201.

Figure 12B:
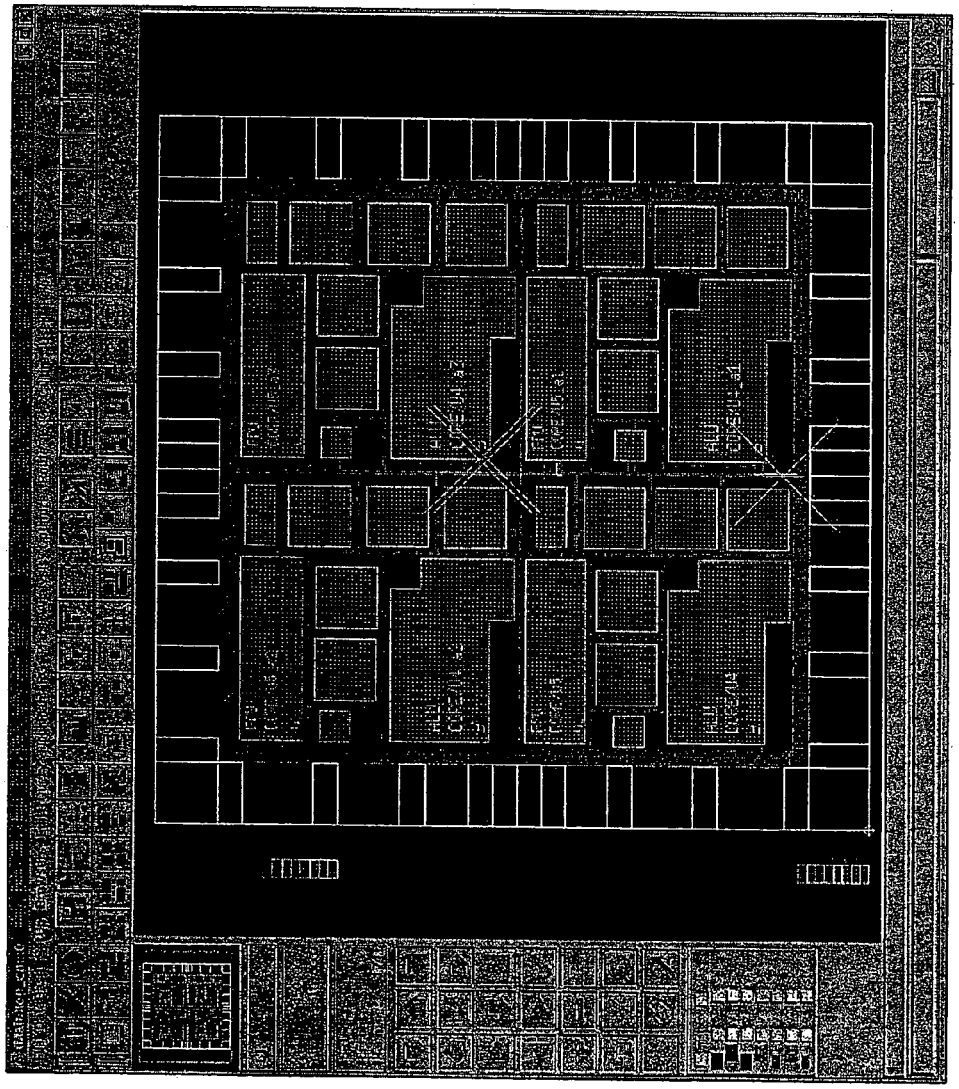

If wiring problems are identified for the wire routing in the received floor plan design 1201, then, in step 1107, the PG wiring analysis module 1007 may optionally display the location of the problems in the received floor plan design 1201. For example, as shown in FIG. 12B, the PG wiring analysis module 1007 has identified the location 1203 of an IR-drop problem and a location 1205 of an electromigration problem.

With various implementations of the invention, PG the wiring analysis module 1007 may identify the location of different problems using different indicators. For example, in FIG. 12B, the location 1203 of the IR-drop problem is marked with a single-crossbar "X" shape. Of course, other examples of the invention may employ any desired indicators to identify the location of different wiring problems. Further, various implementations of the invention may omit displaying the identified wiring problems to the user altogether.

Figure 12C:
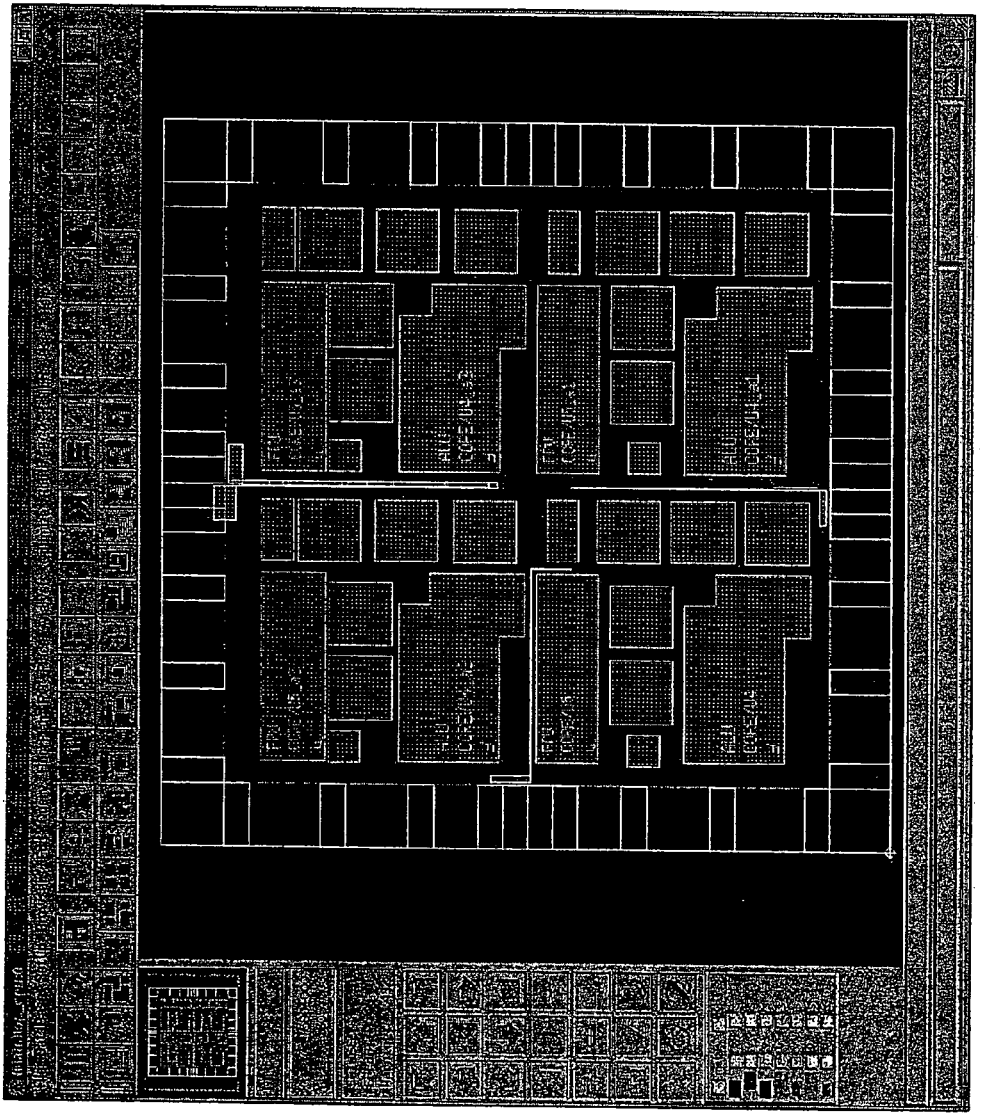

Next, in step 1109, the attribute generation module 1005 generates corrective attributes for the wiring in the received floor plan design 1201 that will correct the identified problems. For example, if the PG wiring analysis module 1007 has determined that a wire in the wire routing is too thin to maintain a specified IR level, then the attribute generation module 1005 determines a minimum width attribute for that wire that will provide the specified IR level. With various examples of the invention, the attribute generation module 1005 may identify the wires 1207 in the received floor plan design 1201 for which corrective attributes have been generated, as illustrated in FIG. 12C.

With various examples of the invention, steps 1103-1109 may each be performed once to identify and correct all desired PG wiring problems. With still other examples of the invention, however, steps 1103-1109 may be repeated for each type of PG wiring problem to be corrected by the PG wire routing optimization tool 1001. Thus, in the illustrated example, steps 1103-1109 are performed to first identify and correct electromigration problems in the wires. Steps 1103-1109 then are repeated to identify and correct IR-drop problems in the PG wires.

Figure 13A:
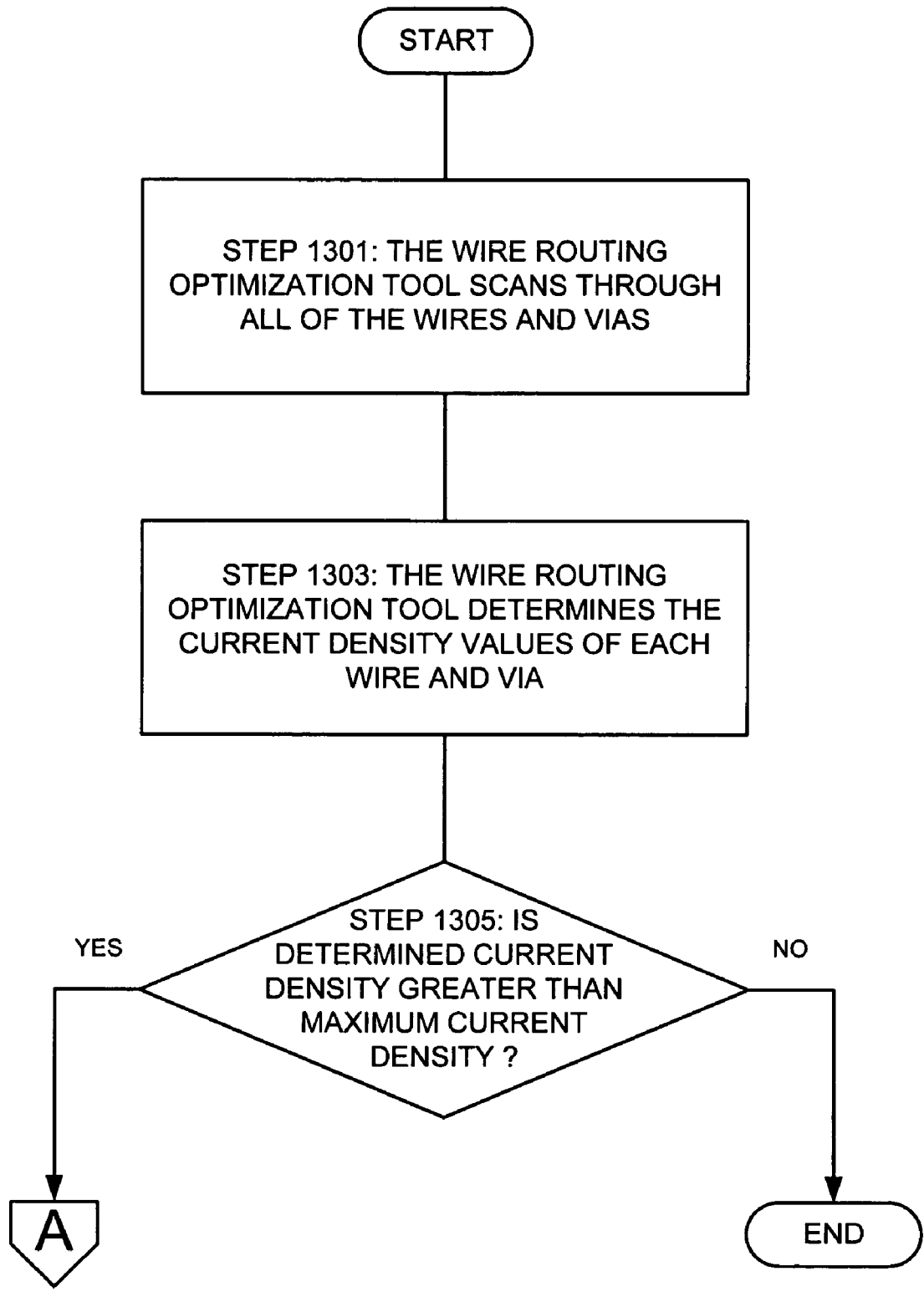
FIGS. 13A and 13B illustrate a flow chart showing a process for identifying and correcting wire electromigration problems according to various examples of the invention.
Figure 13B:
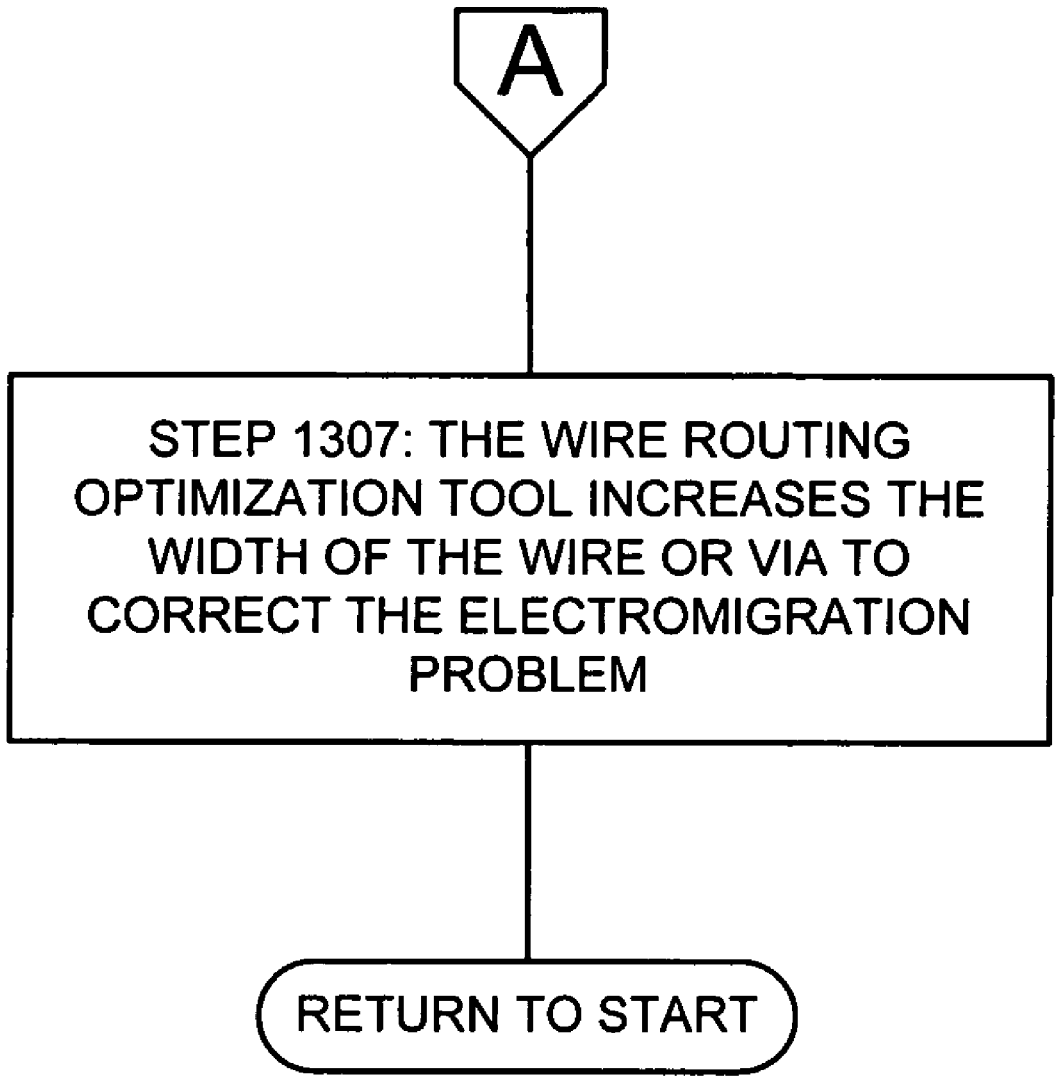

The separate processes of identifying and correcting IR-drop and electromigration problems that may be employed by various implementations of the invention will be discussed in more detail with respect to FIGS. 13A-14B. As seen in FIGS. 13A and 13B, in step 1301 the PG wiring analysis module 1007 scans through all of the relevant wires and vias (i.e., all of the relevant wires and vias in a power-ground network). In step 1303, the PG wiring analysis module 1007 determines the current density values of each wire and via. The PG wiring analysis module 1007 then compares the determined current density for each wire and via with the maximum current density allowable for the wire or via in step 1305. This maximum current density value allowable for each wire and via may be specified, for example, by the foundry that will be manufacturing integrated circuits from the design.

If a wire's or via's determined current density value exceeds its specified maximum allowable current density value, then the PG wiring analysis module 1007 increases the width of the wire or via to correct this electromigration problem in step 1307. More particularly, the PG wiring analysis module 1007 determines an electromigration width size up factor. With various examples of the invention, the electromigration width size up factor may be determined as:

factor=(determined current density value)/(maximum allowable current density value)

The PG wiring analysis module 1007 then determines a new width of the wire or via based upon the electromigration width size up factor. For example, with various implementations of the invention, the PG wiring analysis module 1007 will determine the new width of the wire or via to be:

(new width)=(current width)*electromigration width size up factor.

Steps 1301-1307 are repeated as often as necessary using the new wire and via widths, until the PG wiring analysis module 1007 determines that none of the wires or vias in the design exceeds its maximum allowable current density value. It should be noted that, with various examples of the invention, the PG wiring analysis module 1007 may provide the new wire and via sizes to the attribute generation module 1005 for each iteration of steps 1301-1307, so that the attribute generation module 1005 can have the floor plan design tool 201 update the floor plan design tool for each change in width. With still other examples of the invention, however, the PG wiring analysis module 1007 may provide the new wire and via sizes to the attribute generation module 1005 only after the wiring analysis module 1007 has determined that none of the wires or vias in the design exceeds its maximum allowable current density value.

Figure 14A:
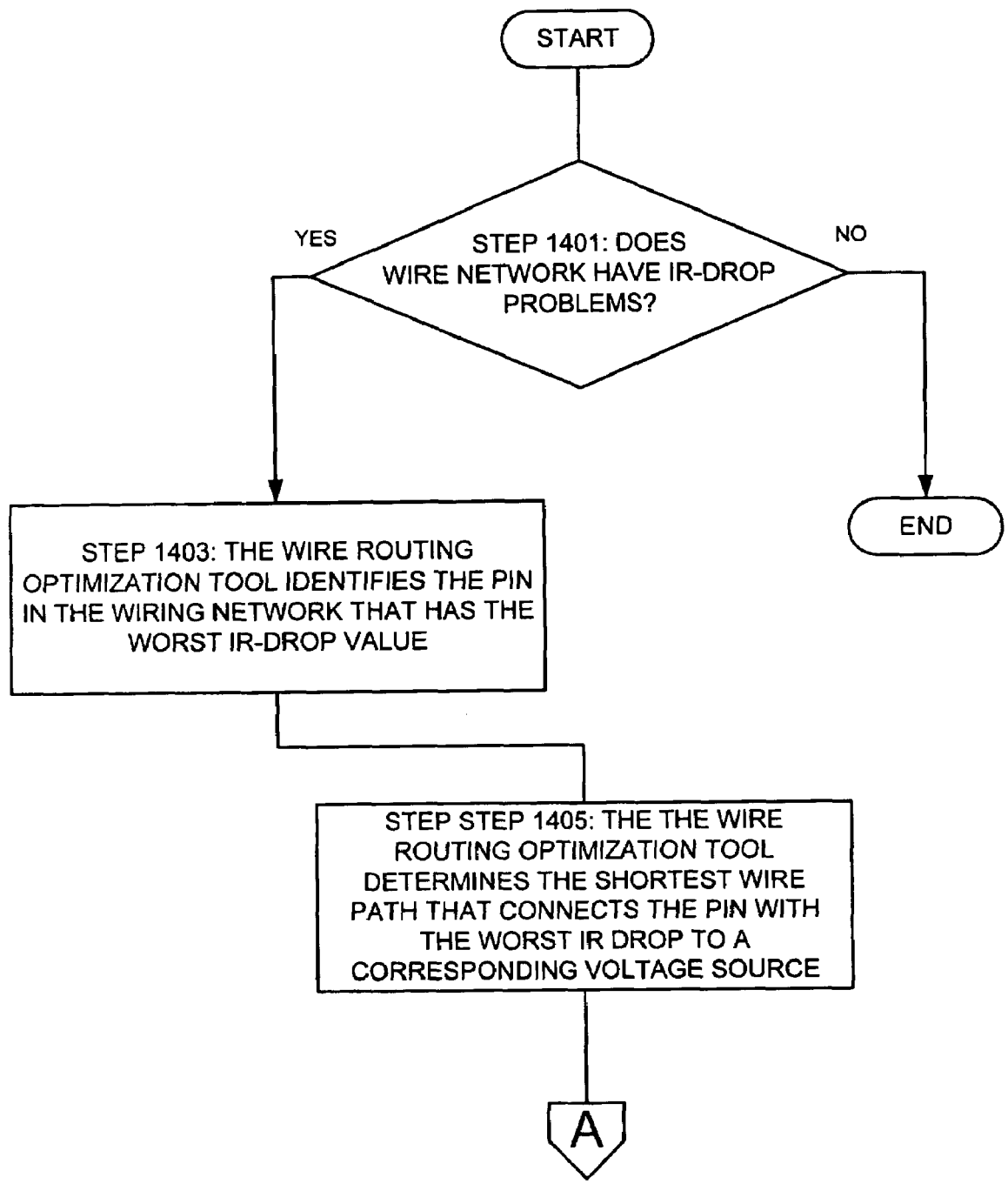
FIGS. 14A and 14B illustrate a flow chart showing a process for identifying and correcting wire electromigration problems according to various examples of the invention.
Figure 14B:
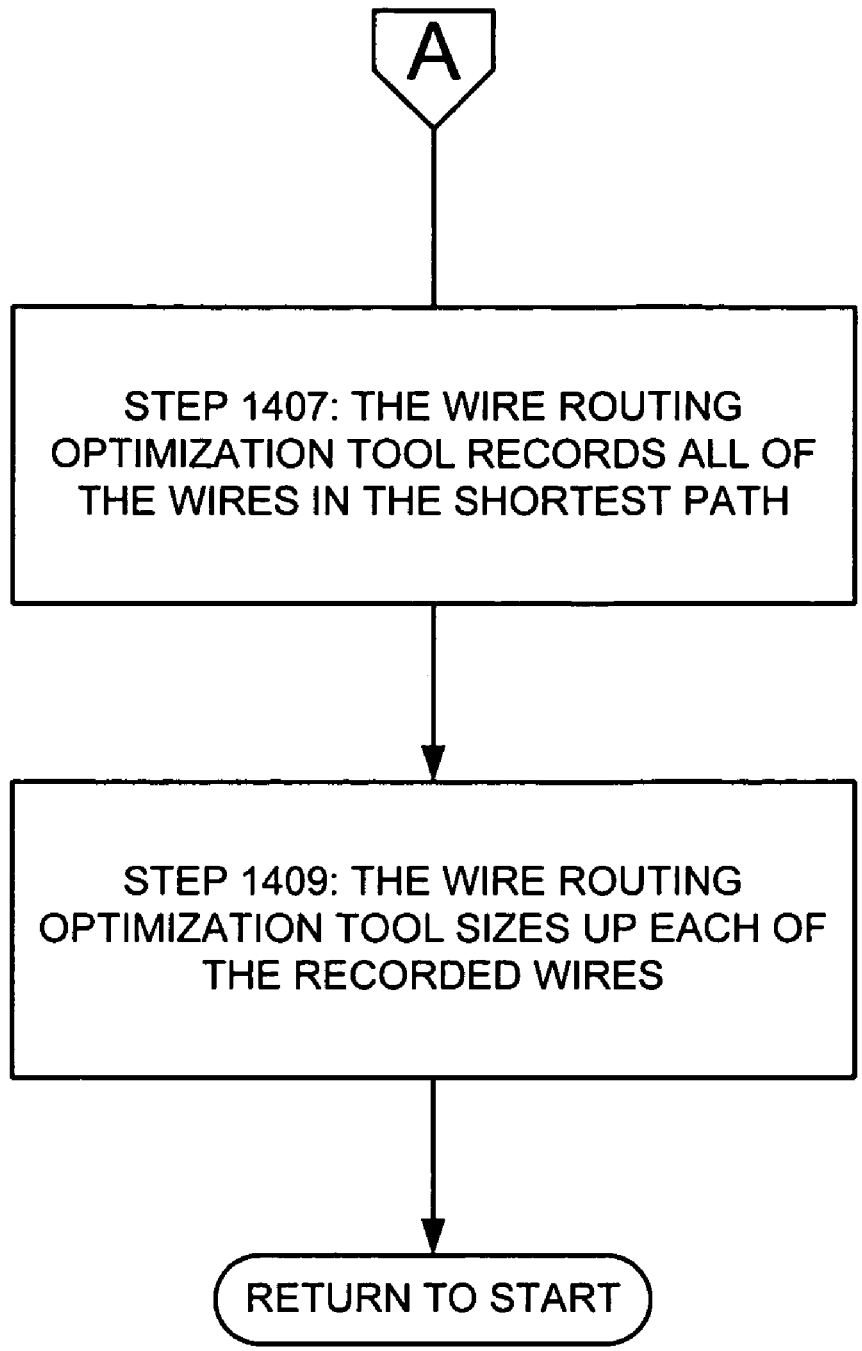

When the PG wiring analysis module 1007 does determine in step 1305 that none of the wires or vias in the design exceeds its maximum allowable current density value, then the PG wire routing optimization tool 1001 processes the PG wire network to correct IR-drop problems. Thus, as shown in FIGS. 14A-14C, in step 1401, the PG wire routing optimization tool 1001 analyzes the circuit design to determine if any of the wires in the PG network has an IR-drop problem. More particularly, the PG wiring analysis module 1007 analyzes the wire network to determine if the IR-drop at one or more of the pins is larger than the IR drop threshold voltage value defined by the circuit designer for that pin. If the PG wire network has one or more IR-drop problems, then in step 1403 the PG wiring analysis module 1007 identifies the pin in the PG wiring network that has the worst IR drop value (e.g., the pin having the largest difference between the IR drop threshold voltage value defined by the circuit designer for the pin and the actual IR drop at the pin). Next, in step 1405, PG wiring analysis module 1007 determines the shortest wire path through the PG wiring network that connects the pin with the worst IR drop to a corresponding voltage source. In step 1407, the PG wiring analysis module 1007 then records all of the wires in that shortest path.

Once the wires in the path have been recorded, the PG wiring analysis module 1007 sizes up those wires in the shortest path in step 1409. More particularly, with the illustrated example of the invention, the PG wiring analysis module 1007 determines an IR-drop width size up factor for each recorded wire. The PG wiring analysis module 1007 may use, for example the following formula to determine the IR-drop width size up factor:

factor=(IR drop threshold voltage value)/(voltage on pin with the worst IR drop value)

The PG wiring analysis module 1007 determines a new width of each recorded wire based upon the IR-drop width size up factor for that wire. For example, with various implementations of the invention, the PG wiring analysis module 1007 will determine the new width of the wire to be:

(new width)=(current width)*IR-drop width size up factor.

Steps 1401-1409 are then repeated as necessary using the new wire widths. Again, with various examples of the invention, the PG wiring analysis module 1007 may provide the new wire sizes to the attribute generation module 1005 for each iteration of steps 1401-1409, so that the attribute generation module 1005 can have the floor plan design tool 201 update the floor plan design tool for each change in width. With still other examples of the invention, however, the PG wiring analysis module 1007 may provide the new wire sizes to the attribute generation module 1005 only after the PG wiring analysis module 1007 has determined that none of the pins has an IR-drop larger than the IR drop threshold voltage value defined by the circuit designer for that pin.

Figure 12D:
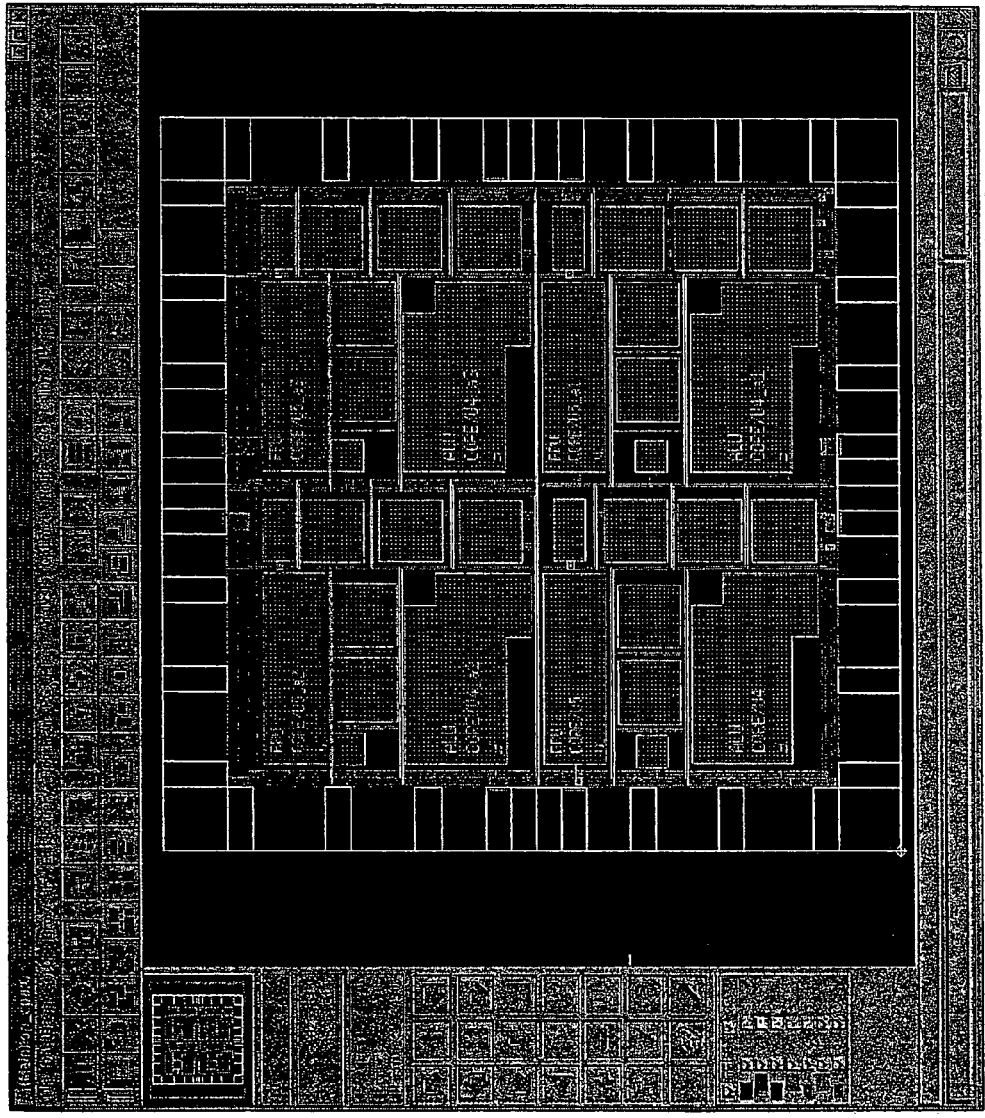

In step 1111, the attribute generation module 1005 provides the generated corrective attributes to the floor plan design tool 201, and invokes the operation of the floor plan design tool 201. For example, in the illustrated implementation of the invention, the generated corrective attributes are stored in the circuit attribute store module 209 of the floor plan design tool 201. With still other implementations of the invention, the attribute generation module 1005 may provide the corrective attributes directly to the circuit layout determination module 207 of the floor plan design tool 201. Once the floor plan design tool 201 has received the corrective attributes, it can then use the corrective attributes to revise the entire floor plan design based upon the corrective attributes, as discussed in detail above. With some examples of the invention, the floor plan design tool 201 will display a corrected floor plan design 1201' with the corrected wiring, as shown in FIG. 12D.

Once the identified wiring problems in the received floor plan design 1201 have been corrected, or if the PG wiring analysis module 1007 determines that there are no wiring problems in the received floor plan design 1201, then the floor plan design 1201 is provided to the area minimization module 1003. In step 1113, the area minimization module 1003 employs an area minimization technique to determine a minimum area for the PG wiring in the received floor plan design 1201 that does not create new wiring problems, such as IR-drop or electromigration problems. For example, with some examples of the invention, the area minimization module 1003 formulates the determination of the area of the PG wires as a linear programming program problem and then employs the well-known "Simplex" algorithm to determine the minimum suitable dimensions for each wire segment in the wiring of the received floor plan design 1201.

In step 1115, the attribute generation module 1005 generates minimization attributes corresponding to the minimum determined dimensions for each wire segment in the PG wiring of the received floor plan design 1201. Then, in step 1117, the attribute generation module 1005 provides the minimization attributes to the floor plan design tool 201, and invokes the operation of the floor plan design tool 201. As previously noted, in the illustrated implementation of the invention, the generated minimization attributes are stored in the circuit attribute store module 209 of the floor plan design tool 201. With still other implementations of the invention, however, the attribute generation module 1005 may provide the minimization attributes directly to the circuit layout determination module 207 of the floor plan design tool 201. Once the floor plan design tool 201 has received the minimization attributes, it can then use the minimization attributes to revise the entire floor plan design based upon the minimization attributes, as discussed in detail above. With some examples of the invention, the floor plan design tool 201 will display a corrected floor plan design 1201' with the minimized PG wiring.

In the illustrated example of the invention, the PG wire routing optimization tool 1001 performs both a wiring analysis to identify and correct PG wiring problems and an area minimization process to minimize the total area of the PG wiring in the received floor plan design 1201. With alternate embodiments of the invention, however, the PG wire routing optimization tool 1001 may perform only the PG wiring analysis process or only the PG wiring minimization process. Thus, alternate implementations of the invention may omit the area minimization module 1003 or the PG wiring analysis module 1007. Also, in the illustrated example, the PG wiring analysis module 1007 conveniently displays the received floor plan design 1201 using the user interface generation module 205 of the floor plan design tool 201. With still other implementations of the invention, however, the PG wire routing optimization tool 1001 may have its own user interface generation module for displaying information such as the received floor plan design, the location of identified PG wiring problems, PG wiring segments to be corrected, and corrected or minimized PG wiring in the floor plan design.

CONCLUSION

Accordingly, various embodiments of the invention provide a tool for optimizing the PG wires in a floor plan design while correcting or avoiding various wiring problems, such as IR-drop problems and electromigration problems. While the invention has been described with respect to specific examples including presently preferred modes of carrying out the invention, those skilled in the art will appreciate that there are numerous variations and permutations of the above described systems and techniques that fall within the spirit and scope of the invention.

What is claimed is:

1. A method of creating a floor plan design for a circuit, comprising:
   a routing optimization computer receiving an initial floor plan design specifying a plurality of blocks and one or more PG wires routed among the blocks;
   receiving design constraints associated with the initial floor plan design;
   identifying problems in the PG wires;
   modifying the PG wires to correct the problems, and comply with the received design constraints; and
   producing a modified floor plan design specifying the modified PG wires,
   wherein the modifying the PG wires comprises:
      identifying a pin connected to one of the PG wires and having a worst IR-drop voltage value;
      determining a shortest path through the PG wires that connects the pin to a corresponding voltage source; and
      increasing a size of each PG wire in the shortest path until the IR-drop voltage value for the pin is less than or equal to a specified IR-drop threshold voltage value.

2. The method recited in claim 1, wherein the problems include IR-drops below a defined threshold.

3. The method recited in claim 1, wherein the problems include occurrences of electromigration.

4. The method recited in claim 1, wherein the design constraints include design rule check parameters.

5. The method recited in claim 1, further comprising manufacturing a circuit using The modified floor plan design.

6. A computer-readable medium having computer-executable instructions for performing the method recited in claim 1.

7. The method recited in claim 1, wherein the modifying the PG wires further comprises:
   minimizing a total area of the PG wires to
      comply with the received design constraints, and
      avoid creating problems in the PG wires.

8. The method recited in claim 7, wherein the problems include IR drops below a defined threshold.

9. The method recited in claim 7, wherein the problems include occurrences of electromigration.

10. The method recited in claim 7, wherein the design constraints include design rule check parameters.

11. The method recited in claim 7, further comprising manufacturing a circuit using the modified floor plan design.

12. A method of creating a floor plan design for a circuit, comprising:
provolumes to a routing optimization computer an initial floor plan design specifying a plurality of blocks and one or more PG wires routed among the blocks;
providing design constraints associated with the initial floor plan design;
receiving an identification of problems in the PG wires;
operating a floor plan design correction tool to modify the PG wires to correct the problems, and comply with the received design constraints; and
receiving a modified floor plan design specifying the modified PG wires,
wherein modifying the PG wires comprises:
identifying a pin connected to one of the PG wires and having a worst IR-drop voltage value;
determining a shortest path through the PG wires that connects the pin to a corresponding voltage source; and
increasing a size of each PG wire in the shortest path until the IR-drop voltage value for the pin is less than or equal to a specified IR-drop threshold voltage value.

13. The method recited in claim 12, wherein the problems include IR drops below a defined threshold.

14. The method recited in claim 12, wherein the problems include occurrences of electromigration.

15. The method recited in claim 12, wherein the design constraints include design rule check parameters.

16. The method recited in claim 12, further comprising manufacturing a circuit using the modified floor plan design.

17. The method recited in claim 12, wherein the modifying the PG wires further comprises:
minimizing a total area of the PG wires to
comply with the received design constraints, and
avoid creating problems in the PG wires.

18. The method recited in claim 17, wherein the problems include IR drops below a defined threshold.

19. The method recited in claim 17, wherein the problems include occurrences of electromigration.

20. The method recited in claim 17, wherein the design constraints include design rule check parameters.

21. The method recited in claim 17, further comprising manufacturing a circuit using the modified floor plan design.

22. The method recited in claim 17, wherein minimizing the total area of the PG wires is based on formulating a determination of the total area of the PG wires as a linear programming problem and solving the linear programming problem using the Simplex algorithm.

23. A system, comprising:
a memory having stored therein machine executable instructions; and
a processor that, when executing the machine executable instructions, causes the system to:
receive an initial floor plan design specifying a plurality of blocks and one or more PG wires routed among the blocks;
identify problems in the PG wires;
receive design constraints associated with the initial floor plan design; and
modify the initial floor plan design by modifying the PG wires to correct the problems and to comply with the received design constraints,
wherein modifying the PG wires includes:
identifying a pin connected to one of the PG wires and having a worst IR-drop voltage value;
determining a shortest path through the PG wires that connects the pin to a corresponding voltage source; and
increasing a size of each PG wire in the shortest path until the IR-drop voltage value for the pin is less than or equal to a specified IR-drop threshold voltage value.

24. The system recited in claim 23, wherein the problems include IR drops below a defined threshold.

25. The system recited in claim 23, wherein the problems include occurrences of electromigration.

26. The system recited in claim 23, wherein the design constraints include design rule check parameters.

27. The system recited in claim 23, wherein the memory has stored therein the initial floor plan design and the design constraints associated with the initial floor plan design.

28. The system recited in claim 23, wherein the modifying the PG wires further includes:
minimizing a total area of the PG wires such that the minimized PG wires comply with the received design constraints and do not contain problems.

29. The system recited in claim 28, wherein the problems include IR drops below a defined threshold.

30. The system recited in claim 28, wherein the problems, include occurrences of electromigration.

31. The system recited in claim 28, wherein the design constraints include design rule check parameters.

32. The system recited in claim 28, wherein minimizing the total area of the wires is based on the Simplex algorithm.

33. The system recited in claim 28, wherein the memory has stored therein the initial floor plan design and the design constraints associated with the initial floor plan design.

34. A method of creating a floor plan design for a circuit, comprising:
a routing optimization computer receiving an initial floor plan design specifying a plurality of blocks and a PG network including one or more wires and vias routed among the blocks;
receiving design constraints associated with the initial floor plan design;
identifying problems in the PG network;
modifying the PG network to correct the problems, and comply with the received design constraints;
minimizing a total area for the modified PG network to comply with the received design constraints, and avoid creating problems in the PG network; and
producing a modified floor plan design specifying the minimized PG network,
wherein modifying the PG network comprises:
determining the current density values of each wire and via in the PG network; and
for each wire and via,
comparing the determined current density for the wire or via with the maximum current density allowable for the wire or via, and
determining that the current density value for the wire or via exceeds the specified maximum allowable current density value for the wire or via, and
in response to the determining that the current density value for the wire or via exceeds the specified maximum allowable current density value, increasing the width of the wire or via based upon an electromigration width size up factor.

35. The method recited in claim 34, wherein the problems include IR drops below a defined threshold.

36. The method recited in claim 34, wherein the problems include occurrences of electromigration.

37. The method recited in claim 34, wherein the design constraints include design rule check parameters.

38. The method recited in claim 34, further comprising manufacturing a circuit using the modified floor plan design.

39. The method recited in claim 34, wherein minimizing the total area of the modified PG network is based on formulating a determination of the total area of the PG wiring as a linear programming problem and solving the linear programming problem using the Simplex algorithm.

40. A method of creating a floor plan design for a circuit, comprising:
   providing to an optimization tool executing on a routing optimization computer an initial floor plan design specifying a plurality of blocks and a PG network including one or more wires and vias routed among the blocks;
   providing the optimization tool with design constraints associated with the initial floor plan design; and
   instructing the optimization tool to
      identify problems in the PG network,
      modify the PG network to correct the problems and comply with the received design constraints, and
      minimize a total area for the modified PG network to comply with the received design constraints and avoid creating problems in the PG network,
   wherein modifying the PG network comprises:
   determining the current density values of each wire and via in the PG network; and
   for each wire and via,
      comparing the determined current density for the wire or via with the maximum current density allowable for the wire or via, and
      determining that the current density value for the wire or via exceeds the specified maximum allowable current density value for the wire or via, and
      in response to the determining that the current density value for the wire or via exceeds the specified maximum allowable current density value, increasing the width of the wire or via based upon an electromigration width size up factor.

41. The method recited in claim 40, wherein the problems include IR drops below a defined threshold.

42. The method recited in claim 40, wherein the problems include occurrences of electromigration.

43. The method recited in claim 40, wherein the design constraints include design rule check parameters.

44. The method recited in claim 40, further comprising manufacturing a circuit using the modified floor plan design.

45. The method recited in claim 40, wherein minimizing the total area of the modified PG network is based on formulating a determination of the total area of the PG wires as a linear programming problem and solving the linear programming problem using the Simplex algorithm.

46. A system, comprising:
   a memory having stored therein machine executable instructions; and
   a processor that, when executing the machine executable instructions, causes the system to:
   receive an initial floor plan design specifying a plurality of blocks and a PG network including one or more wires and vias routed among the blocks;
   identify problems in the PG network;
   receive design constraints associated with the initial floor plan design; and
   modify the PG network to correct the problems and comply with the received design constraints; and
   minimize a total area for the modified PG network to comply with the received design constraints and avoid creating problems in the PG network;
   wherein modifying the PG network comprises:
   determining the current density values of each wire and via in the PG network; and
   for each wire and via,
      comparing the determined current density for the wire or via with the maximum current density allowable for the wire or via, and
      determining that the current density value for the wire or via exceeds the specified maximum allowable current density value for the wire or via, and
      in response to the determining that the current density value for the wire or via exceeds the specified maximum allowable current density value, increasing the width of the wire or via based upon an electromigration width size up factor.

47. The system recited in claim 46, wherein the problems include IR drops below a defined threshold.

48. The system recited in claim 46, wherein the problems include occurrences of electromigration.

49. The system recited in claim 46, wherein the design constraints include design rule check parameters.

50. The system recited in claim 46, wherein the processor is configured to minimize the total area of the modified PG network by formulating a determination of the total area of the PG wires as a linear programming problem and solving the linear programming problem using the Simplex algorithm.

51. The system recited in claim 46, further comprising a memory storing at least one of the initial floor plan design and the design constraints associated with the initial floor plan design.

52. A method of correcting electromigration problems in a wiring network of an integrated circuit design, comprising:
   a routing optimization computer determining the current density values of each wire and via in the wiring network;
   for each wire and via,
      comparing the determined current density for the wire and via with the maximum current density allowable for the wire or via, and
      determining that the current density value for the wire or via exceeds the specified maximum allowable current density value for the wire or via, and
      in response to the determining, increasing the width of the wire or via based upon an electromigration width size up factor.

53. The method of correcting electromigration problems in a wiring network recited in claim 52, wherein the maximum current density allowable for the wire or via is specified by a foundry that will be manufacturing integrated circuits from the integrated circuit.

54. The method of correcting electromigration problems in a wiring network recited in claim 52, further comprising
   determining the electromigration width size up factor as:
   electromigration width size up factor=(determined current density value)/(maximum allowable current density value), and
   determining a new width of the wire or via to be (new width)=(current width of the wire or via)*electromigration width size up factor.

55. A method of correcting IR-drop problems in a wiring network of an integrated circuit design, comprising:
   a routing optimization computer identifying a pin in the wiring network that has the worst IR-drop value;

determining a shortest wire path through the wiring network that connects the pin with the worst IR drop value to a corresponding voltage source; and increasing a size of each wire in the shortest path until an IR-drop voltage value for the pin is less than or equal to a specified IR-drop threshold voltage value.

56. The method of correcting IR-drop problems in a wiring network recited in claim 55, further comprising increasing the size of each wire in the shortest path based upon an IR-drop width size up factor.

57. The method of correcting IR-drop problems in a wiring network recited in claim 56, further comprising:

determining the IR-drop width size up factor to be: IR-drop width size up factor=(the specified IR drop threshold voltage value)/(voltage on the pin with the worst IR drop value); and determining a new width of each wire in the shortest path as (new width)=(current width of the wire)*IR-drop width size up factor.

58. One or more tangible computer storage media having instruction stored therein, the instructions when executed causing a processor to perform:

determining the current density values of each wire and via in the wiring network;

for each wire and via, comparing the determined current density for the wire and via with the maximum current density allowable for the wire or via, and determining that the current density value for the wire or via exceeds the specified maximum allowable current density value for the wire or via, and in response to the determining, increasing the width of the wire or via based upon an electromigration width size up factor.

59. The one or more computer storage media recited in claim 58, the instructions when executed causing the processor to further perform:

determining the electromigration width size up factor as: electromigration width size up factor=(determined current density value)/(maximum allowable current density value), and determining a new width of the wire or via to be (new width)=(current width of the wire or via)*electromigration width size up factor.

60. One or more tangible computer storage media having instruction stored therein, the instructions when executed causing a processor to perform:

identifying a pin in the wiring network that has the worst IR-drop value;

determining a shortest wire path through the wiring network that connects the pin with the worst IR drop value to a corresponding voltage source; and increasing a size of each wire in the shortest path until an IR-drop voltage value for the pin is less than or equal to a specified IR-drop threshold voltage value.

61. The one or more computer storage media recited in claim 60, the instructions when executed causing the processor to further perform:

increasing the size of each wire in the shortest path based upon an IR-drop width size up factor.

62. The one or more computer storage media recited in claim 61, the instructions when executed causing the processor to further perform:

determining the IR-drop width size up factor to be: IR-drop width size up factor=(the specified IR drop threshold voltage value)/(voltage on the pin with the worst IR drop value); and determining a new width of each wire in the shortest path as (new width)=(current width of the wire)*IR-drop width size up factor.

\* \* \* \* \*